(12) United States Patent
Yanagawa et al.

(10) Patent No.: US 10,882,471 B2
(45) Date of Patent: Jan. 5, 2021

(54) IN-VEHICLE SEMICONDUCTOR DEVICE

(71) Applicant: Hitachi Automotive Systems, Ltd., Hitachinaka (JP)

(72) Inventors: Yoshimitsu Yanagawa, Tokyo (JP); Masahiro Matsumoto, Tokyo (JP); Hiroshi Nakano, Tokyo (JP); Akira Kotabe, HItachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 322 days.

(21) Appl. No.: 15/769,700

(22) PCT Filed: Sep. 13, 2016

(86) PCT No.: PCT/JP2016/076943
§ 371 (c)(1),
(2) Date: Apr. 19, 2018

(87) PCT Pub. No.: WO2017/073188
PCT Pub. Date: May 4, 2017

(65) Prior Publication Data
US 2018/0304829 A1 Oct. 25, 2018

(30) Foreign Application Priority Data
Oct. 28, 2015 (JP) ................. 2015-212168

(51) Int. Cl.
*B60R 16/02* (2006.01)
*G05F 1/56* (2006.01)
(Continued)

(52) U.S. Cl.
CPC ........... *B60R 16/0207* (2013.01); *B60L 3/04* (2013.01); *B60W 50/00* (2013.01); *F02D 45/00* (2013.01);
(Continued)

(58) Field of Classification Search
CPC ... B60R 16/0207; F02D 45/00; H03K 17/223; B60L 3/04; G05F 1/56
See application file for complete search history.

(56) References Cited

U.S. PATENT DOCUMENTS

2007/0063289 A1 3/2007 Kojima et al.
2008/0309163 A1* 12/2008 Hashimoto ........... H02J 7/0029
307/31
(Continued)

FOREIGN PATENT DOCUMENTS

JP 2002-369594 A 12/2002
JP 2004-326415 A 11/2004
(Continued)

OTHER PUBLICATIONS

Japanese-language International Search Report (PCT/ISA/210) issued in PCT Application No. PCT/JP2016/076943 with English translation dated Dec. 20, 2016 (four (4) pages).
(Continued)

*Primary Examiner* — Daniel Kessie
(74) *Attorney, Agent, or Firm* — Crowell & Moring LLP

(57) ABSTRACT

Even when a positive/negative surge is applied to a power-supply line, occurrence of malfunction in a semiconductor device is lessened. In an in-vehicle semiconductor device, regulators convert an externally-supplied voltage to generate voltages. A voltage monitoring unit includes a voltage monitoring circuit and a switch, and monitors first to third voltages. An internal circuit has a processor operated by the voltage, and an oscillator operated by the voltage and generating a clock signal to be provided the processor. The voltage monitoring unit stops providing the clock signal to the processor when the voltage level of at least any one of the first to third voltages is below a set value. The voltage monitoring unit provides the clock signal to the processor
(Continued)

when the voltage levels of all the first to third voltages exceed the set value.

12 Claims, 14 Drawing Sheets

(51) Int. Cl.
*H01L 29/00* (2006.01)
*B60W 50/00* (2006.01)
*H03K 17/082* (2006.01)
*F02D 45/00* (2006.01)
*B60L 3/04* (2006.01)
*H03K 17/22* (2006.01)
*F02D 41/26* (2006.01)

(52) U.S. Cl.
CPC ............... *G05F 1/56* (2013.01); *H01L 29/00* (2013.01); *H03K 17/082* (2013.01); *H03K 17/223* (2013.01); *F02D 41/266* (2013.01); *F02D 2400/14* (2013.01)

(56) References Cited

U.S. PATENT DOCUMENTS

| | | | |
|---|---|---|---|
| 2012/0286843 A1* | 11/2012 | Kurokawa | H01L 27/0266 327/318 |
| 2016/0380567 A1* | 12/2016 | Grafling | H02J 7/0091 322/28 |

FOREIGN PATENT DOCUMENTS

| | | |
|---|---|---|
| JP | 2007-81009 A | 3/2007 |
| JP | 2008-217523 A | 9/2008 |
| JP | 2009-22152 A | 1/2009 |

OTHER PUBLICATIONS

Japanese-language Written Opinion (PCT/ISA/237) issued in PCT Application No. PCT/JP2016/076943 dated Dec. 20, 2016 (four (4) pages).

* cited by examiner

IN-VEHICLE SEMICONDUCTOR DEVICE

TECHNICAL FIELD

The present invention relates to an in-vehicle semiconductor device, more particularly, to a technique useful for reducing malfunction due to a negative surge applied to a power supply line.

BACKGROUND ART

In the semiconductor devices, semiconductor devices including a regulator and an oscillator are widely used. The regulator converts an externally-supplied voltage into a stabilized, predetermined voltage level, and then provides the voltage level to internal circuitry of the semiconductor device. The oscillator generates an operation clock for the internal circuitry.

Mounting a regulator on a semiconductor device is advantageous in terms of protection against a noise. This is because the regulator can absorb variation in power-supply voltage to some extent. However, if the voltage of the power line exceeds the operation range of the regulator due to the noise, the regulator cannot supply a rated internal voltage.

In the event of a drop in power-supply voltage provided to the oscillator, abnormal oscillation of the oscillator and the like may cause an extremely fast frequency to be supplied to a logic circuit of the internal circuitry and the like, and in turn a malfunction may occur.

One of the techniques for preventing such a malfunction is, for example, to utilize a circuit to monitor the input and output voltages of the regulator placed on the semiconductor device, that is, voltage at a power supply terminal and internal voltage, respectively, to reset the internal circuitry when voltage drop occurs (see, e.g., Patent Literature 1).

In the technique in Patent Literature 1, because the internal circuitry is continuously reset during the voltage drop, even in a case where the internal state of the semiconductor device varies to an invalid value, the internal circuitry can be covered through a reset.

In another technique, a circuit monitors the output voltage of the regulator which provides voltage to a processor and stops a clock supply to the processor during voltage abnormalities so that the internal state is prevented from being rewritten for malfunction prevention (see, e.g., Patent Literature 2).

CITATION LIST

Patent Literature

Patent Literature 1: Japanese Unexamined Patent Application Publication No. 2004-326415
Patent Literature 2: Japanese Unexamined Patent Application Publication No. 2008-217523

SUMMARY OF INVENTION

Technical Problem

An in-vehicle semiconductor device has responsibility for critical functions such as controlling and sensing various statuses of a motor vehicle, and therefore the in-vehicle semiconductor device is required of high reliability so that no malfunction occurs due to noise as described above. The in-vehicle semiconductor device, which may be likely to be exposed to strong noise, is required of a high degree of noise resistance as compare of consumer products.

For example, it is known that, if surge noise is applied to a wire harness through which power supply is supplied from an engine control unit, so-called ECU (Engine Control Unit), to the in-vehicle semiconductor unit, the voltage at a power supply terminal of the in-vehicle semiconductor device varies within a range of about plus or minus several tens of volts.

However, the above-described techniques in Patent Literatures 1, 2 have been designed for consumer-use equipment, and therefore the techniques are inadequate for protecting the in-vehicle semiconductor device from positive and negative surges.

Specifically, in the technique described in Patent Literature 1, the processor is reset every time a voltage abnormality occurs. Upon a reset on the processor, an initialization process is executed. So normal program execution is suspended over a relatively long time period, for example, about 80 μsec or more.

On the other hand, in an in-vehicle LSI, there is a possibility that a surge is applied, for example, even during operation of a motor vehicle. Because of this, the shutdown time period of the processor must be as short as possible, not to mention that no malfunction occurs. Therefore, it is difficult to apply the technique described in Patent Literature 1 to the use of protecting the in-vehicle semiconductor device.

On the other hand, in the technique described in Patent Literature 2, during occurrence of a power abnormality, the clock is stopped in order to prevent a malfunction. Upon the clock being supplied again, the routine operation can be maintained. Since there is no reset operation, the period of time to stop the operation is suppressed to a minimum.

However, the technique assumes that the clock is supplied externally. It cannot handle a malfunction caused by abnormal oscillation which may occur when the clock is incorporated. Further, the technique of Patent Literature 2 is aimed mainly at addressing a voltage drop at the time of abrupt variations in load and unexpected power shutdown, and therefore the case where the power supply reaches negative voltage is not assumed.

Although details will described later, upon the power supply terminal becoming negative voltage, a parasitic transistor present on the semiconductor device is activated to cause electrical charges to flow out, so that the voltage of the semiconductor device is reduced as a whole, resulting in negative voltage in some cases.

If an absolute value of the internal negative voltage exceeds a forward voltage (roughly, the order of 0.6V to 0.7V) of a diode, there is a possibility that the data held in a memory device such as a flip-flop or the like is rewritten regardless of the presence or absence of clock. Also, there is a possibility that the malfunction prevention circuit itself is incorrectly operated. The technique described in Patent Literature 2 has a problem of not allowing for such a case.

An object of the present invention is to provide a technique for enabling lessening the occurrence of malfunction in a semiconductor device even if a positive/negative surge is applied to a power supply line.

The above and other objects and novel features of the present invention will be more apparent from the following description of the specification and the accompanying drawings.

Solution to Problem

The following is a brief description of an overview of typical aspects of the invention disclosed in the present application.

Specifically, a typical in-vehicle semiconductor device has a first regulator, a second regulator, an internal circuit and a voltage monitor unit. The first regulator converts a voltage level of an externally supplied first voltage to generate a second voltage. The second regulator converts a voltage level of the first voltage to generate a third voltage.

Each of the second voltage and the third voltage is provided to the internal circuit. The voltage monitoring unit monitors the first, second and third voltages. The internal circuit has a processor and an oscillator.

The processor is operated by the second voltage provided from the first regulator. The oscillator is operated by the third voltage provided from the second regulator, and generates a clock signal serving as an operation clock for the processor.

Further, the voltage monitoring unit stops providing the clock signal to the processor when the voltage level of at least any one of the first, second and third voltages is below a set value. The voltage monitoring unit provides the clock signal to the processor when the voltage levels of all the first, second and third voltages exceed the set value.

Further, the in-vehicle semiconductor device has a surge protection circuit that absorbs a surge applied to the first voltage. The first voltage monitored by the voltage monitoring unit is provided from the surge protection circuit.

In particular, the voltage monitoring unit outputs a first control signal when the voltage level of at least one of the first, second and third voltages is below the set value, and outputs a second control signal when all the voltage levels of the first, second and third voltages exceed the set value.

Based on the first or second control signal output from a voltage monitoring circuit, a switch unit provides or stops providing the clock signal to the processor.

Advantageous Effects of Invention

The following is a brief description of the advantageous effect produced by representative aspect of the invention disclosed in the present application.

An in-vehicle semiconductor device with high resistance against malfunction can be provided.

DESCRIPTION OF EMBODIMENTS

In the following embodiments, for the sake of convenience, as necessary, the description will be divided into a plurality of sections or embodiments, but, unless otherwise specified, they will not be unconnected with each other. Rather, one of them will be connected with a modification, details, supplemental remarks and the like of part or a whole of another of them.

Further, the number of elements and the like (including piece count, numeric values, amount/quantity, range and the like) refereed in the following embodiments are not limited to a specific number unless otherwise specified or explicitly limited to a specific number in principle, and the like, and any number greater or less than the specific number may be used.

Further, it should be understood that, in the following embodiments, the other components (including element steps and the like) are not necessarily essential unless otherwise specified or determined to be explicitly essential in principle, and the like.

Similarly, a shape, a positional relationship and the like of a component and the like refereed in the following embodiments include any shape and the like such as being analogous or similar to the shape and the like in effect unless otherwise specified or determined to be explicitly analogous or similar in principle, and the like. The same holds true for the numerical values and range described above.

Further, throughout all the drawings for illustrating embodiments, the same member is indicated with the same reference sign, and a redescription is omitted.

First Embodiment

An embodiment will now be described in detail.
<Example Configuration of in-Vehicle Semiconductor Device>

Figure 1:
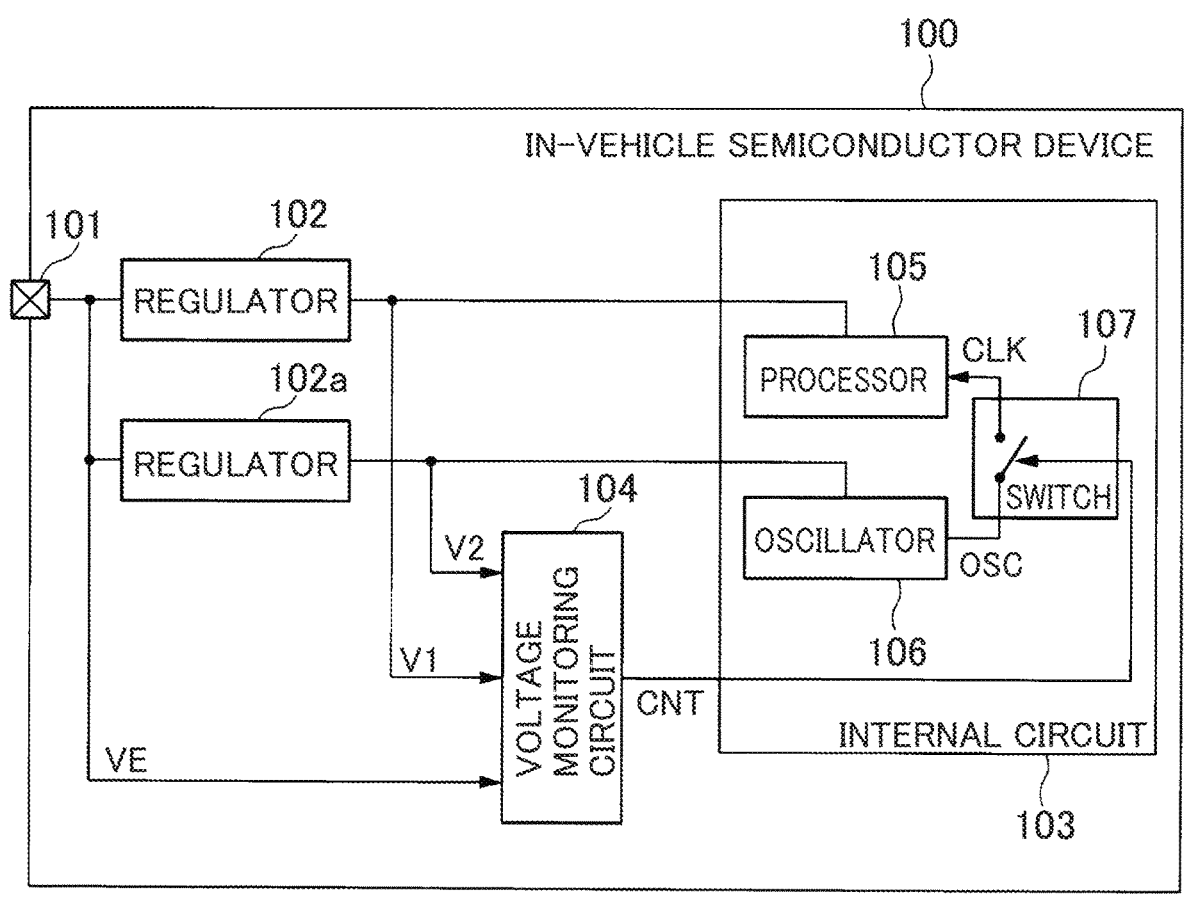
FIG. 1 is an illustrative block diagram showing an example configuration of an in-vehicle semiconductor device in accordance with a first embodiment.

FIG. 1 is an illustrative block diagram showing an example configuration of an in-vehicle semiconductor device 100 in accordance with a first embodiment.

As illustrated in FIG. 1, the in-vehicle semiconductor device 100 has a power supply terminal 101, regulators 102, 102a, an internal circuit 103, and a voltage monitoring circuit 104. The power supply terminal 101 is an external input terminal to which a voltage VE which is operation voltage of the in-vehicle semiconductor device 100 is supplied.

The voltage VE is a first voltage, for example, a voltage of around 5 V. The voltage VE is supplied from, for example, an ECU which is not shown. The ECU is a unit that acquires information from, for example, each of sensors of an engine power train, and calculates a most-suitable amount of fuel injection, most-suitable fuel-injection timing, most-suitable ignition timing, a most-suitable idling speed, and the like for the engine state for output of control instructions.

The regulators 102, 102a convert the voltage VE supplied from the ECU into voltages V1, V2 which are operation voltages of the internal circuit 103, respectively. Each of the voltages V1, V2 is a voltage of around 3.3V. The regulator 102 is a first regulator, and the regulator 102a is a second regulator. The voltage V1 is a second voltage, and the voltage V2 is a third voltage.

The voltage monitoring circuit 104 monitors the voltages VE, V1, V2. Upon decrease in the voltages VE, V1, V2, the voltage monitoring circuit 104 outputs a control signal CNT. Also, the voltage monitoring circuit 104 is supplied with, for example, the voltage V1 as an operation power supply.

The internal circuit 103 is a logic circuit integrated into the in-vehicle semiconductor device 100, and has a processor 105, an oscillator 106 and a switch 107. The above-described voltage monitoring circuit 104 and the switch 107 forms part of a voltage monitoring unit.

The processor 105 is supplied with the voltage V1 as an operation voltage, which is generated by the regulator 102. The oscillator 106 is supplied with the voltage V2 as an operation voltage, which is generated by the regulator 102a.

The oscillator 106 generates a clock OSC. The clock OSC output from the oscillator 106 is supplied as a clock signal CLK to the processor 105 via the switch 107. The clock signal CLK is an operation clock for the processor 105. The switch 107 stops supplying the clock signal CLK on the basis of the control signal CNT output from the voltage monitoring circuit 104.

Subsequently, the operation in the in-vehicle semiconductor device 100 in FIG. 1 is described.

Initially, the voltage VE supplied from the ECU to the power supply terminal 101 is converted into voltages V1, V2 and stabilized by the regulators 102, 102a, respectively, and then the voltages V1, V2 are provided respectively to the processor 105 and the oscillator 106.

If a voltage VE to be supplied to the power supply terminal 101 is changed by a surge, as long as the voltage falls within an operation voltage range of the regulator, the stabilized voltages V1, V2 are continuously supplied in a similar manner. However, in the in-vehicle semiconductor device 100, an excessive change of the voltage VE may cause the regulator to be unable to operate properly.

<Example Surge Application>

Figure 3:
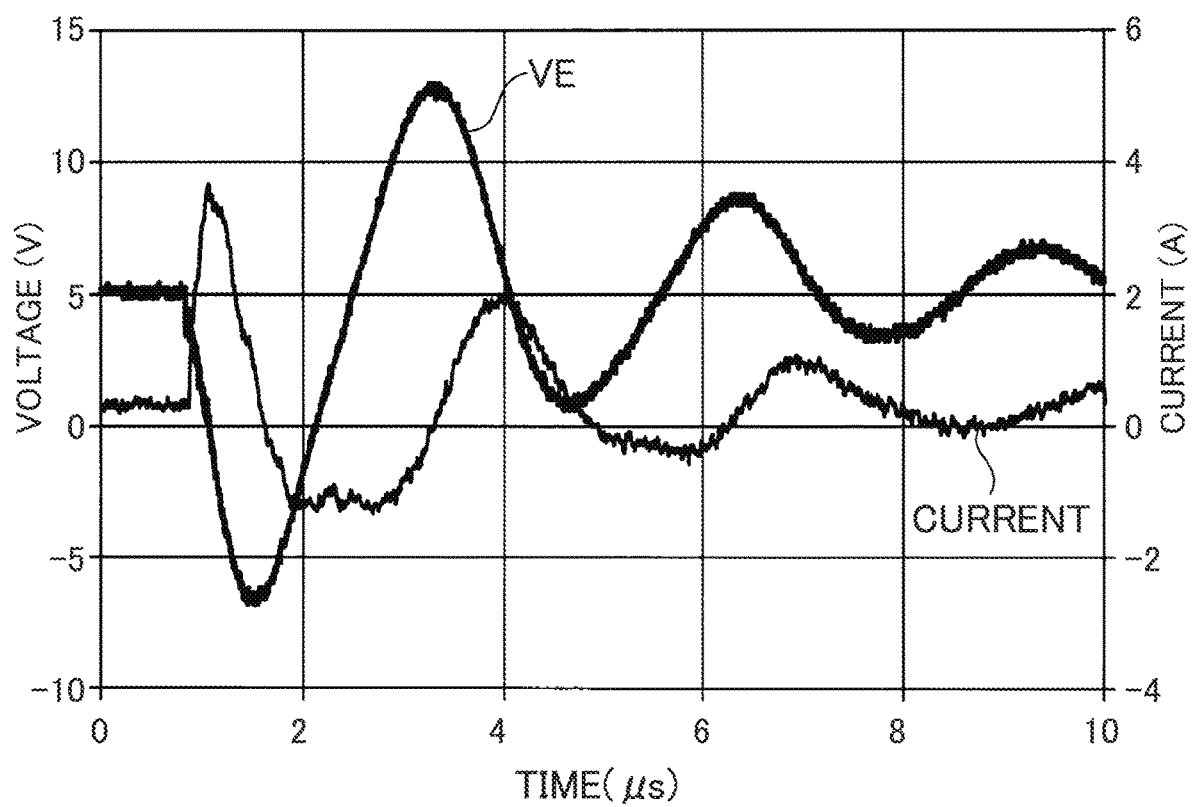
FIG. 3 is an illustrative graph showing an example waveform when a surge is applied to a power supply terminal of the in-vehicle semiconductor device in FIG. 1.

FIG. 3 is an illustrative graph showing an example waveform when a surge is applied to the power supply terminal 101 of the in-vehicle semiconductor device 100 in FIG. 1.

FIG. 3 illustrates an example of specifications of voltage supplied externally, i.e., a voltage VE of 5 V, and specifications of internal voltage, i.e., a voltage V1 of 3.3 V.

In FIG. 3, approximately 10 amperes of surge current is induced in a wire harness, and as a result, the voltage VE to be supplied to the in-vehicle semiconductor device 100 drops from original 5 V to approximate −7 V for 1 μsec or less at high speed.

Under such negative voltage condition, the regulator does not operate. Therefore, shortly subsequent to the voltage VE drop, the internal voltage also drops, causing unstable operation of a logic gate. Further, if a clock is input during unstable input of a synchronous circuit such as a flip-flop or the like, the held values may be possibly rewritten. As a result, a malfunction may occur in the processor.

<Example Operation of Voltage Monitoring Circuit>

Subsequently, the operation of the voltage monitoring circuit 104 is described with reference to FIG. 2.

Figure 2:
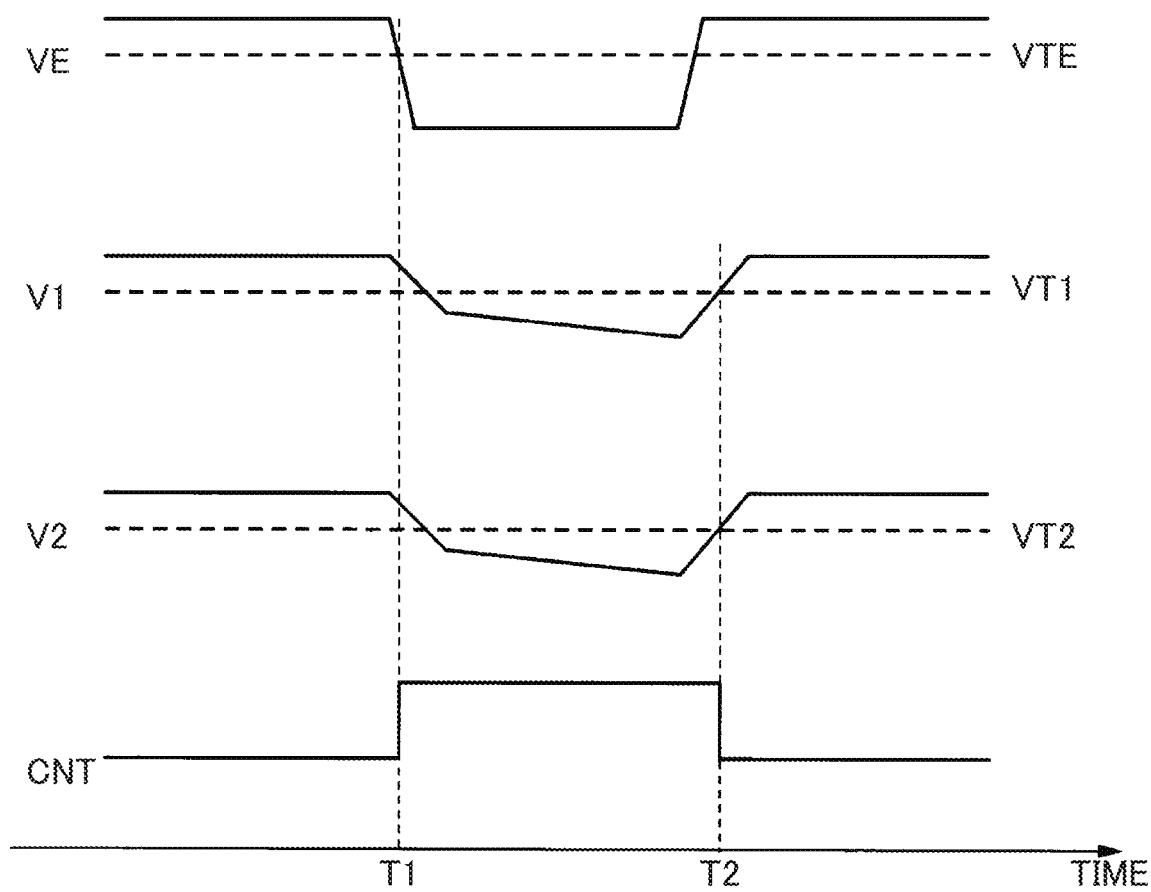
FIG. 2 is a timing chart showing example operation in a voltage monitoring circuit of the in-vehicle semiconductor device in FIG. 1.

FIG. 2 is a timing chart showing example operation in the voltage monitoring circuit 104 of the in-vehicle semiconductor device 100 in FIG. 1. FIG. 2 shows timing for each signal output from the voltage monitoring circuit 104 when the voltage VE drops due to a negative surge.

From the top toward the bottom of FIG. 2, FIG. 2 separately shows signal timing for the voltage VE supplied from the ECU, the voltage V1 output from the regulator 102, the voltage V2 output from the regulator 102a, and the control signal CNT output from the voltage monitoring circuit 104.

First, a negative surge is applied to the voltage supply line to thereby reduce the voltage. Subsequently, the control of the regulators 102, 102a becomes ineffective to thereby reduce the respective voltages V1, V2.

The voltage monitoring circuit 104 monitors each of the voltages VE, V1, V2, and detection thresholds VTE, VT1, VT2 are set for the voltages VE, V1, V2. The detection threshold VTE is a first set value, the detection threshold VT1 is a second set value, and the detection threshold VT2 is a third set value.

The voltage monitoring circuit 104 compares the voltage VE with the detection threshold VTE, compares the voltage V1 with the detection threshold VT1, and compares the voltage V2 with the detection threshold VT2. Then, where the voltages VE, V1, V2 are less than the detection thresholds VTE, VT1, VT2, the control signal CNT becomes active to shut down the internal circuit. The control signal CNT activated is a first control signal. Here, the activation of the control signal CNT is referred to as Hi level.

Upon input of the control signal CNT of Hi level to the switch 107, the switch 107 stops providing the clock signal CLK to the processor 105. The switch 107 is implemented by a 2-input 1-output OR gate, which receives, for example, the control signal CNT and the clock OSC as input, and provides the clock signal CLK as output. Upon the control signal CNT becoming Hi level, regardless of a value of the clock OSC, the clock signal CLK is fixed to Hi level. Because of this, the provision of the clock signal CLK to the processor 105 is stopped.

Subsequently, the case a serge noise comes into an end is described.

The voltage monitoring circuit 104 monitors each of the voltages VE, V1, V2, and determines whether or not all the voltages VE, V1, V2 exceed the detection thresholds VTE, VT1, VT2, respectively.

Where all the voltages VE, V1, V2 exceed the detection thresholds VTE, VT1, VT2, the voltage monitoring circuit 104 outputs a control signal CNT which is inactive, i.e., of Lo level. Here, the inactive control signal CNT is a second control signal. Upon input of the Lo-level control signal CNT, the switch 107 provides the clock signal CLK to the processor 105.

In this manner, the voltage monitoring circuit 104 monitors a voltage level of the voltage VE supplied from the ECU, thereby enabling quick detection of a voltage drop. Because of this, the application of the clock signal CLK is stopped before the voltage V1 generated by the regulator 102 drops significantly. In other words, before the voltage V1 significantly dropped is provided to the processor 105, the application of the clock signal CLK can be stopped.

As a result, the resistance against malfunction of the processor 105 can be increased. Further, after detecting that all the voltages VE, V1, V2 have been recovered, the application of the clock signal CLK to the processor 105 is restarted, and therefore the resistance against malfunction can be increased.

<Example Configuration of Voltage Monitoring Circuit>

Figure 4:
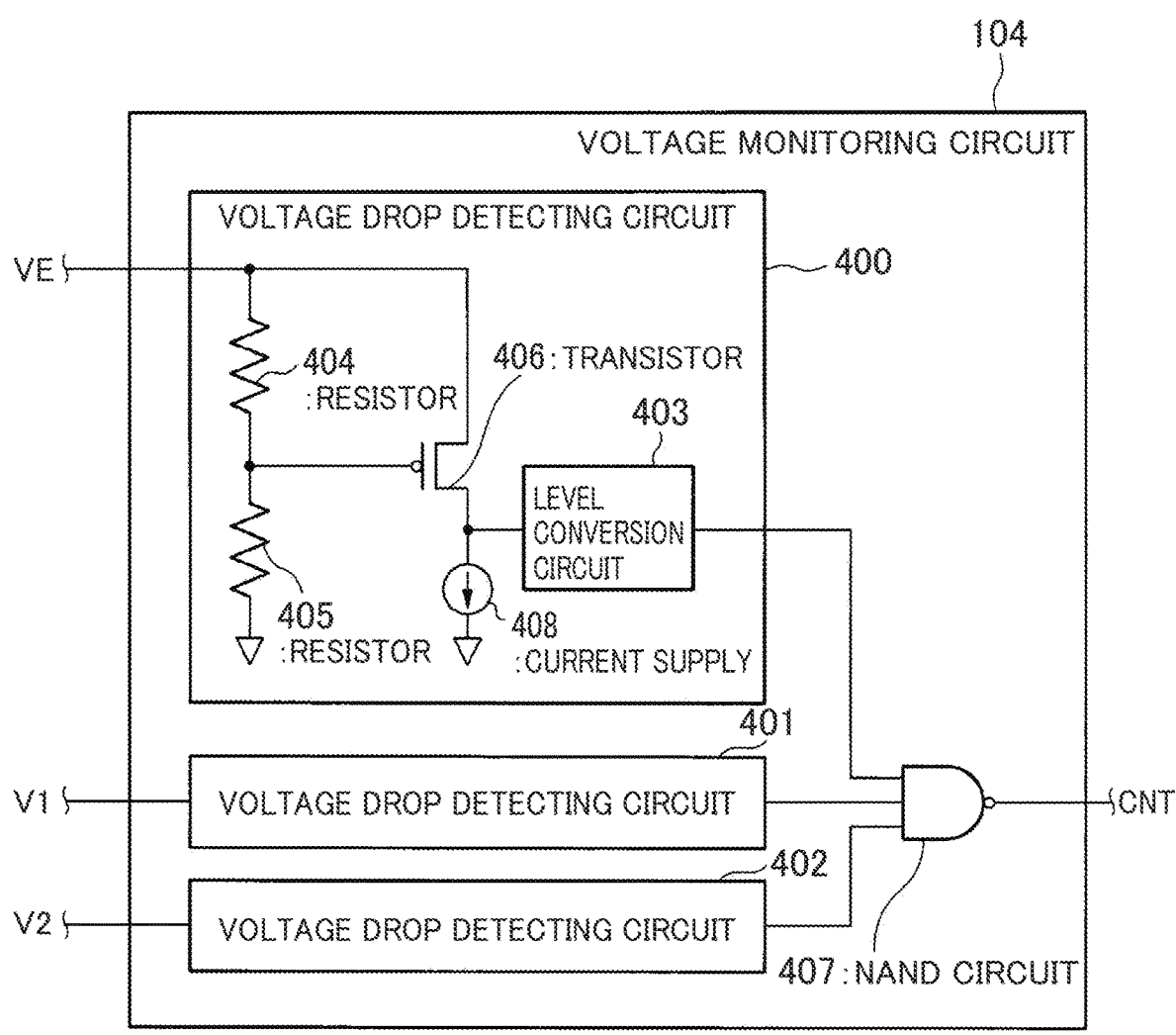
FIG. 4 is an illustrative block diagram showing an example configuration in a voltage monitoring circuit of the in-vehicle semiconductor device in FIG. 1.

FIG. 4 is an illustrative block diagram showing an example configuration in the voltage monitoring circuit 104 of the in-vehicle semiconductor device 100 in FIG. 1.

As illustrated in FIG. 4, the voltage monitoring circuit 4 has voltage drop detecting circuits 400, 401, 402 and a NAND circuit 407. The voltage drop detecting circuit 400 monitors the voltage VE. The voltage drop detecting circuit 401 monitors the voltage V1, and the voltage drop detecting circuit 402 monitors the voltage V2. The voltage drop detecting circuits 400, 401, 402 serve respectively as a first voltage drop detecting circuit, a second voltage drop detecting circuit, and a third voltage drop detecting circuit. The NAND circuit 407 serves as a control-signal generator.

The voltage drop detecting circuit 400 includes resistors 404, 405 which are voltage divider resistors, a transistor 406, a current supply 408 and a level conversion circuit 403. The resistor 404 and the resistor 405 are connected in series between ground potential and an input part of the voltage drop detecting circuit 400. The voltage VE is input to the input part of the voltage drop detecting circuit 400.

The transistor 406 includes, for example, a P-channel MOS (Metal Oxide Semiconductor), and the voltage VE is connected to an end of a source/drain of the transistor 406.

The junction of the resistor 404 and the resistor 405 is connected to a gate of the transistor 406, and the current supply 408 as a load, which feeds a constant electric current, is connected between ground potential and the other end of the source/drain of the transistor 406.

Also, an input part of the level conversion circuit 403 is connected to the other end of the source/drain of the transistor 406. An input part of the NAND circuit 407 is connected to an output part of the level conversion circuit 403. The level conversion circuit 403 is a so-called level shifter, which outputs the incoming signal after matching a logic level to be input to the NAND circuit 407.

It should be noted that the voltage drop detecting circuits 401, 402 are similar in configuration to the voltage drop detecting circuit 400, but are different in that the voltages V1, V2 are input respectively to the input parts of the voltage drop detecting circuits 401, 402.

The NAND circuit 407 takes a negative AND of the signals output from the voltage drop detecting circuits 400 to 402, and outputs the signal as a control signal CNT.

The voltage drop detecting circuit 400 compares the current of the current supply 408 with the current passing through the transistor 406 by the voltage VE. Then, if the voltage VE is below a certain threshold, that is, the detection threshold VTE, the voltage drop detecting circuit 400 outputs a Lo-level signal. Here, the Lo signal output from the voltage drop detecting circuit 400 is a first detection signal, and the Hi signal output from the voltage drop detecting circuit 400 is a second detection signal. Likewise, in the voltage drop detecting circuit 401, a Lo signal output from the voltage drop detecting circuit 401 is a third detection signal, and a Hi signal output from the voltage drop detecting circuit 401 is a fourth detection signal. Likewise, a Lo signal and a Hi signal output from the voltage drop detecting circuit 402 area fifth detection signal and a sixth detection signal, respectively.

The detection threshold VTE is adjusted by a voltage division ratio of the resistor 404 and the resistor 405 and the current supply 408. Therefore, the adjustment can be facilitated by the voltage division ratio of the resistors 404, 405 and the current supply 408.

Further, since the NAND circuit 407 takes a negative AND of the signals output respectively from the voltage drop detecting circuits 400 to 402, an active control signal CNT is output in the event where a voltage drop occurs in any of the voltages VE, V1, V2 under monitoring.

Such a simply designed configuration enables an improvement in noise resistance of the voltage monitoring circuit itself, which in turn enables an increase in resistance against malfunction of the in-vehicle semiconductor device 100.

It is noted that the voltage output by the transistor 406 and the current supply 408 is dependent on the monitored voltage. Therefore, the optional level conversion circuit 403 is provided to adjust signal level of each input to the NAND circuit 407. This configuration enables a further increase in reliability of a logic decision of the NAND circuit 407, thus ensuring stable output of the control signal CNT.

Advantageous Effects

Advantageous effects of the in-vehicle semiconductor device 100 in the first embodiment will now be described.

Initially, monitoring the voltage VE input to the power supply terminal 101 enables quick detection of a voltage drop due to a surge.

As a result, before the voltages V1, V2 drop significantly, the provision of the clock signal CLK to the processor 105 can be stopped.

Further, in addition to the voltage V1 provided to the processor 105, the voltage V2 provided to the oscillator 106 is also subject to monitoring. Thereby, even in the event where the clock signal CLK may oscillate incorrectly, it is also possible to stop providing the clock signal CLK.

Further, by taking the negative AND of the detection results of voltage drops in the voltages VE, V1, V2, it is made possible to restart providing the clock signal CLK after all the voltages VE, V1, V2 have returned to within the normal range.

Thus, the in-vehicle semiconductor device 100 with higher resistance against malfunction can be implemented. Further, the reliability of operation of the voltage monitoring circuit 104 itself can be increased by installing the level conversion circuit 403, or a level shifter, at the output of the voltage drop detecting circuit 400.

Second Embodiment

<Overview>

In a second embodiment, a technique is described by which the reliability of the voltage monitoring circuit 104 can be increased by decreasing a drop in the voltage VM serving as an operation voltage of the voltage monitoring circuit 104 itself, during the application of surge.

<Example Configuration and Operation of in-Vehicle Semiconductor Device>

Figure 5:
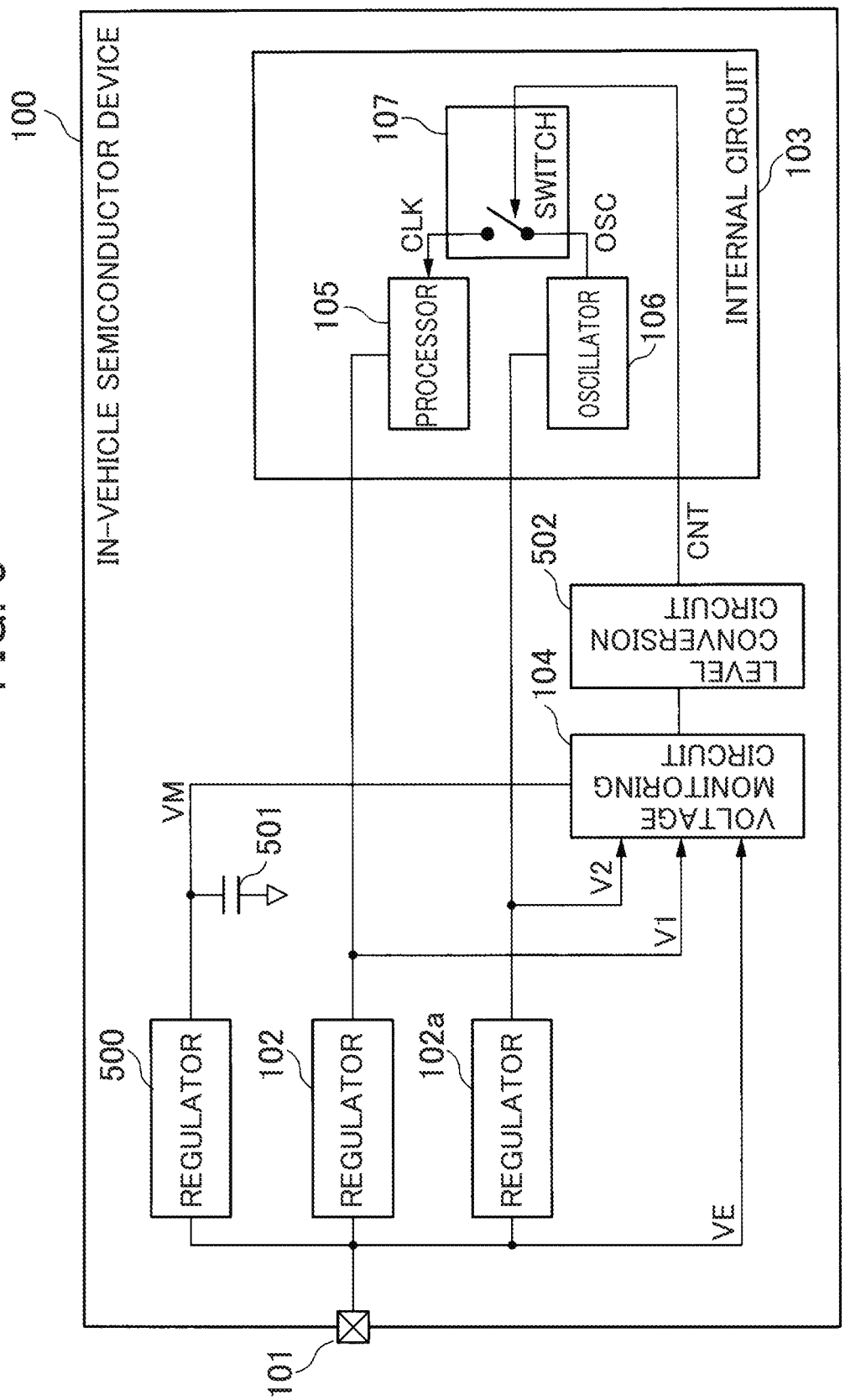
FIG. 5 is an illustrative block diagram showing an example configuration of an in-vehicle semiconductor device in accordance with a second embodiment.

FIG. 5 is an illustrative block diagram showing an example configuration of the in-vehicle semiconductor device 100 in accordance with the second embodiment.

The in-vehicle semiconductor device 100 illustrated in FIG. 5 further includes a regulator 500, a capacitor 501 and a level conversion circuit 502 in addition to a configuration similar to the configuration illustrated in FIG. 1 in accordance with the first embodiment in which the power supply terminal 101, the regulators 102, 102a, the internal circuit 103 and the voltage monitoring circuit 104 are included.

The regulator 500 is a third regulator, which generates a voltage VM from the voltage VE supplied from the ECU. The voltage VM is a fourth voltage, which is provided to the voltage monitoring circuit 104 as an operation voltage for the voltage monitoring circuit 104.

The capacitor 501 serves as a backup power supply for the voltage monitoring circuit 104. When the regulator 500 is rendered inoperable to cause a voltage VM drop due to a surge, electrical charges are discharged from the capacitor 501 to maintain the voltage level of the voltage VM.

The level conversion circuit 502 is a level shifter, which matches a signal output from the voltage monitoring circuit 104 with a logic level of the internal circuit 103 and then outputs the signal as a control signal CNT.

Thus, when a surge is applied, a drop in the voltage VM of the voltage monitoring circuit 104 itself can be decreased to reduce the occurrence of malfunctions of the voltage monitoring circuit 104.

This can offer further enhanced reliability of the voltage monitoring circuit 104.

Third Embodiment

<Overview>

In the third embodiment, a technique is described by which to lessen the voltage drop in the voltages V1, V2 to be provided to the internal circuit 103 of the in-vehicle semiconductor device 100.

<Example Configuration and Operation of in-Vehicle Semiconductor Device>

Figure 6:
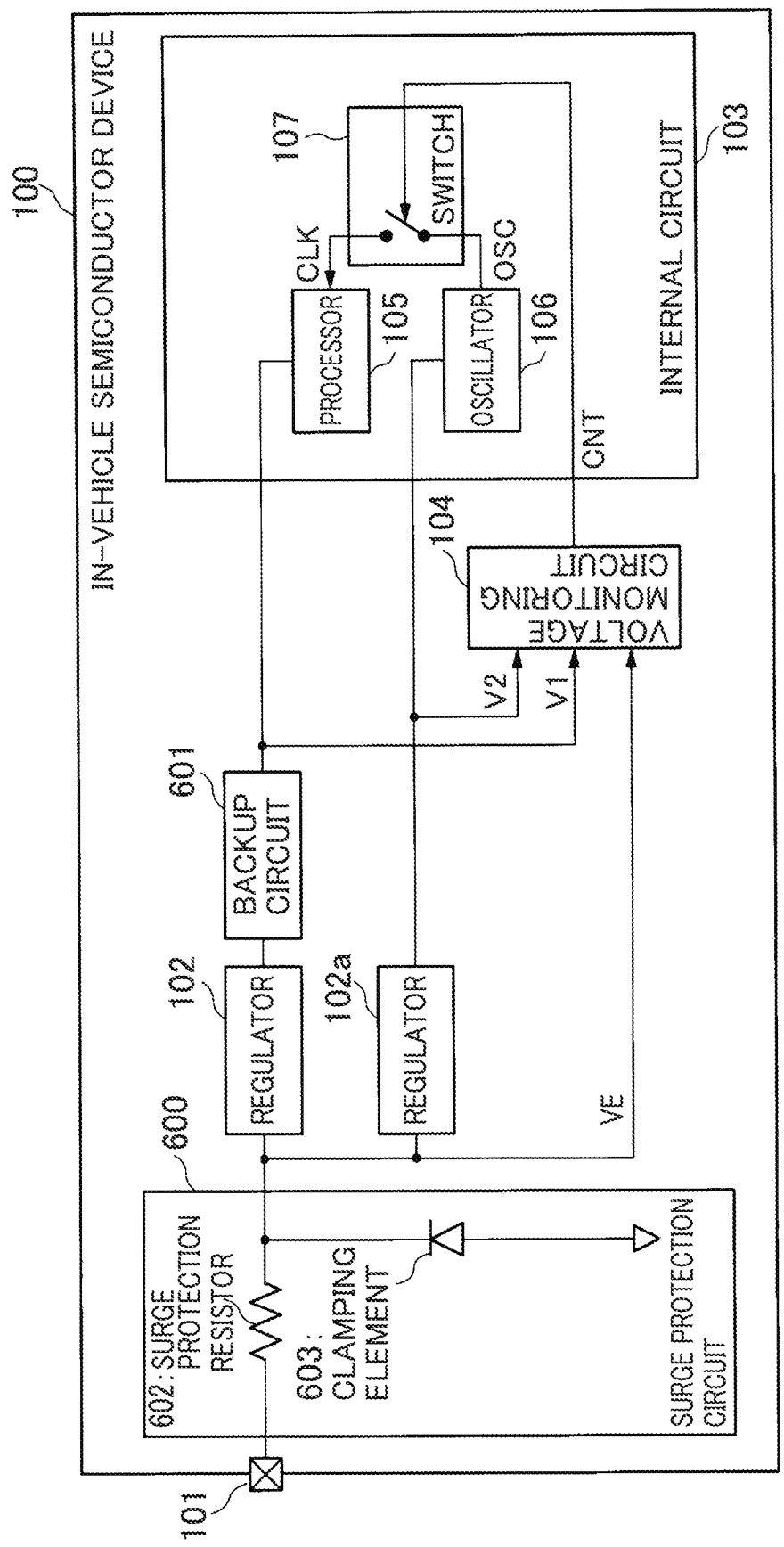
FIG. 6 is an illustrative block diagram showing an example configuration of an in-vehicle semiconductor device in accordance with a third embodiment.

FIG. 6 is an illustrative block diagram showing an example configuration of the in-vehicle semiconductor device 100 in accordance with the third embodiment.

The in-vehicle semiconductor device 100 illustrated in FIG. 6 further includes a surge protection circuit 600 and a backup circuit 601 in addition to a configuration similar to the in-vehicle semiconductor device 100 illustrated in FIG. 1 in accordance with the first embodiment. Other connection arrangements are similar to FIG. 1, and a description is omitted.

The surge protection circuit 600 has a surge protection resistor 602 and a clamping element 603. The surge protection resistor 602 is a resistor and the clamping element 603 is a diode.

Figure 7:
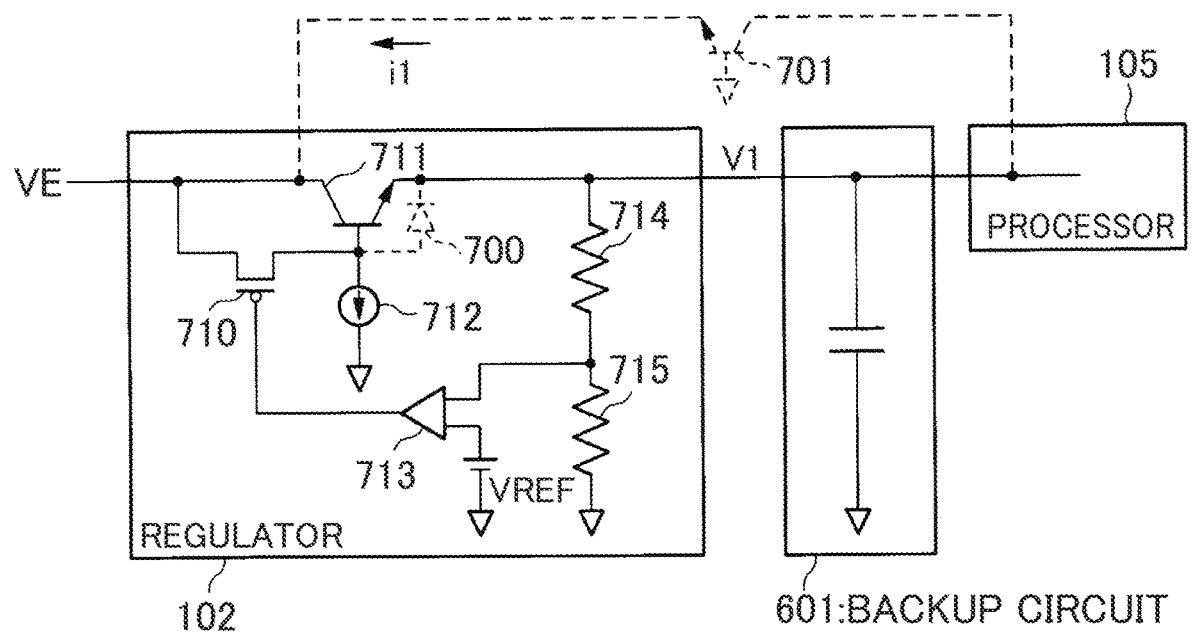
FIG. 7 is an illustrative diagram showing an example configuration and an example parasitic element in a regulator and a backup circuit of the in-vehicle semiconductor device in FIG. 6.

The surge protection circuit 600 is a circuit to protect the regulators 102, 102a from a surge applied to the voltage VE. Also, the backup circuit 601 includes a capacitor and the like as illustrated in FIG. 7, which will be described later. The backup circuit 601 suppresses a voltage drop of the voltage V1 generated by the regulator 102.

The surge protection resistor 602 has one end connected to the power supply terminal 101, and the other end to which one end of the clamping element 603, i.e., a cathode of the diode, and the input parts of the regulators 102, 102a are connected respectively. The other end of the clamping element 603, i.e., an anode of the diode, is connected to ground potential which is a reference potential. It is noted that although FIG. 6 illustrates an example that a diode is used as the clamping element 603, a MOS transistor or a bipolar transistor may be used as well. For example, in the case of using an N-channel MOS, a so-called ggNMOS (gate grounded NMOS) is employed, in which a gate and a source are connected to a ground terminal, and a drain terminal is connected to the other end of the surge protection resistor 602.

The backup circuit 601 is connected to an output part of the regulator 102, so that the voltage V1 generated by the regulator 102 is output through the backup circuit 601.

With the configuration illustrated in FIG. 6, in addition to the same advantageous effects in the in-vehicle semiconductor device 100 described in the first embodiment, it is possible to reduce the amount of drop in the voltages V1, V2 when a negative surge is applied.

<Reduction in Amount of Drop in Voltages V1, V2 at Application of Negative Surge>

The reasons will be described below with reference to FIG. 6 and FIG. 7.

FIG. 7 is an illustrative diagram showing an example configuration and an example parasitic element in the regulator 102 and the backup circuit 601 of the in-vehicle semiconductor device 100 in FIG. 6.

The regulator 102 has transistors 710, 711, a current source 712, an amplifier 713, and resistors 714, 715. The transistor 710 includes, for example, P-channel MOS, while the transistor 711 includes a bipolar transistor.

The backup circuit 601 includes a capacitor as described above. One end of the capacitor is connected to the output part of the regulator 102, and the other end of the capacitor is connected to ground potential.

The regulator 102 uses the amplifier 713 to monitor the voltage V1, and uses the transistor 710 to regulate a base current of the transistor 711 in order to maintain the voltage V1 at a desired voltage. Incidentally, although FIG. 7 illustrates an example of combining the P-channel MOS transistor 710 to control the base current of the transistor 711 which is a NPN-bipolar transistor, combinations are not limited to this. Needless to say, a PNP bipolar transistor and an N-channel MOS transistor may be used for a combination.

Further, in FIG. 7, a parasitic transistor 700 shown with the dotted lines is a parasitic transistor formed in the transistor 711, and a parasitic transistor 701 is a parasitic bipolar transistor formed between the processor 105 and the regulator 102.

First, upon application of a negative surge to the voltage VE, voltage at the power supply terminal 101 drops to, for example, about −7 V. At this time, as shown in FIG. 7, since the parasitic base-emitter diode 700 of the transistor 711 is reverse-biased, the electric charges held in the capacitor which is the backup circuit 601 do not escape through the transistor 711, and therefore the amount of drop in the voltage V1 is suppressed.

However, if the voltage VE drops to the point where a potential difference between the voltage VE and the voltage V1 becomes not less than a breakdown voltage of the parasitic diode 700 or an emitter-collector breakdown voltage of the transistor 711, a current may flow from the backup circuit 601 toward the power supply terminal 101 to result in a voltage V1 drop.

To avoid this, the amount of drop in the voltage VE input to the regulator 102 is suppressed by the surge protection resistor 602 and the clamping element 603 shown in FIG. 6.

A final voltage of the voltage VE is based on a voltage division ratio and the amount of forward voltage drop at the clamping element 603, the voltage division ratio being determined by a resistance value of the surge protection resistor 602 and the forward on-resistance of the clamping element 603. For example, the final voltage of the voltage VE may be suppressed to around −2V, which is not greater than the breakdown voltage of the parasitic diode 700.

There is another factor in reducing the voltage of the internal circuit 103. The factor is the parasitic transistor 701 existing between the processor 105 and the regulator 102.

Figure 8:
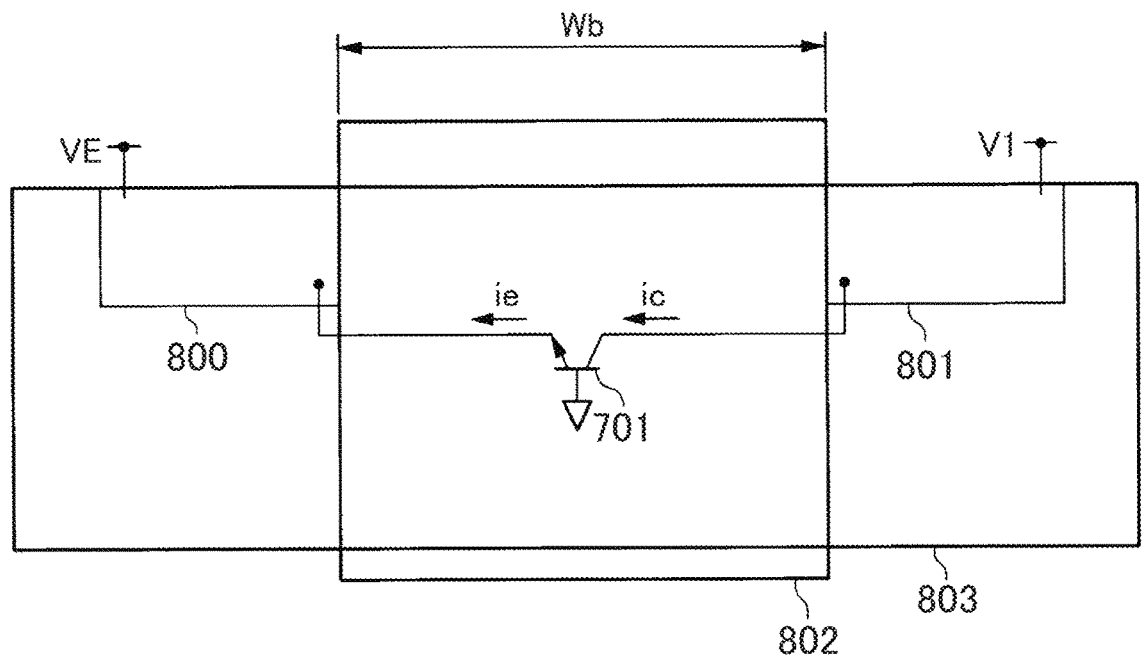
FIG. 8 is an illustrative diagram showing an example schematic cross section of a parasitic transistor in FIG. 7.

FIG. 8 is an illustrative diagram showing an example schematic cross section of the parasitic transistor 701 in FIG. 7.

As illustrated in FIG. 8, the parasitic transistor 701 is formed among an N-well 800, an N-well 801 and P-substrate 803. The P type substrate 803 is a semiconductor substrate, and the N-well 800, which is a first N type well, is formed on the left side in an upper portion of the P type substrate 803.

Also, the N-well 801 is formed on the right side of the upper portion of the P type substrate 803. The N-well 801 is a second N type well. The N-well 800 is a region to which the voltage VE in the regulator 102 is provided, and the N-well 801 is a region to which the voltage V1 in the processor 105 is provided.

Although the case where the P-substrate 803 is a semiconductor substrate is described herein, the semiconductor substrate may be a P type substrate 803 with a P type well formed thereon. In this case, the N-wells 800, 801 are each formed on the P type well.

If the voltage VE becomes a negative voltage because of surge application, a base current passes from the P-type substrate 803 at ground potential toward the emitter of the parasitic transistor 701. As a result, the parasitic transistor 701 is turned ON, so that a collector current is passes from the N-well 801 toward the N-well 800, and therefore the backup capacity is discharged to result in a V1 drop.

To address this, in the in-vehicle semiconductor device 100 in FIG. 6, for the purpose of suppressing the collector current is to reduce the amount of drop in the voltage V1, an isolation region 802 illustrated in FIG. 8 is further arranged between the regulator 102 and the internal circuit 103.

The relationship between a length Wb of the isolation region 802 and a current gain α can be expressed by the following equation.

Equation 1

In the equation, γ is an injection efficiency of minority carriers at the emitter junction; β* is an emitter-grounded direct current gain; $\sigma_B$, $\sigma_E$ are conductivities of the base and the emitter, respectively; and $L_N$, $L_P$ are minority carrier diffusion lengths at the emitter and the base, respectively.

The current gain α is preferably set to at least 0.5 or less in order to prevent the amplification action of the parasitic transistor.

Figure 9:
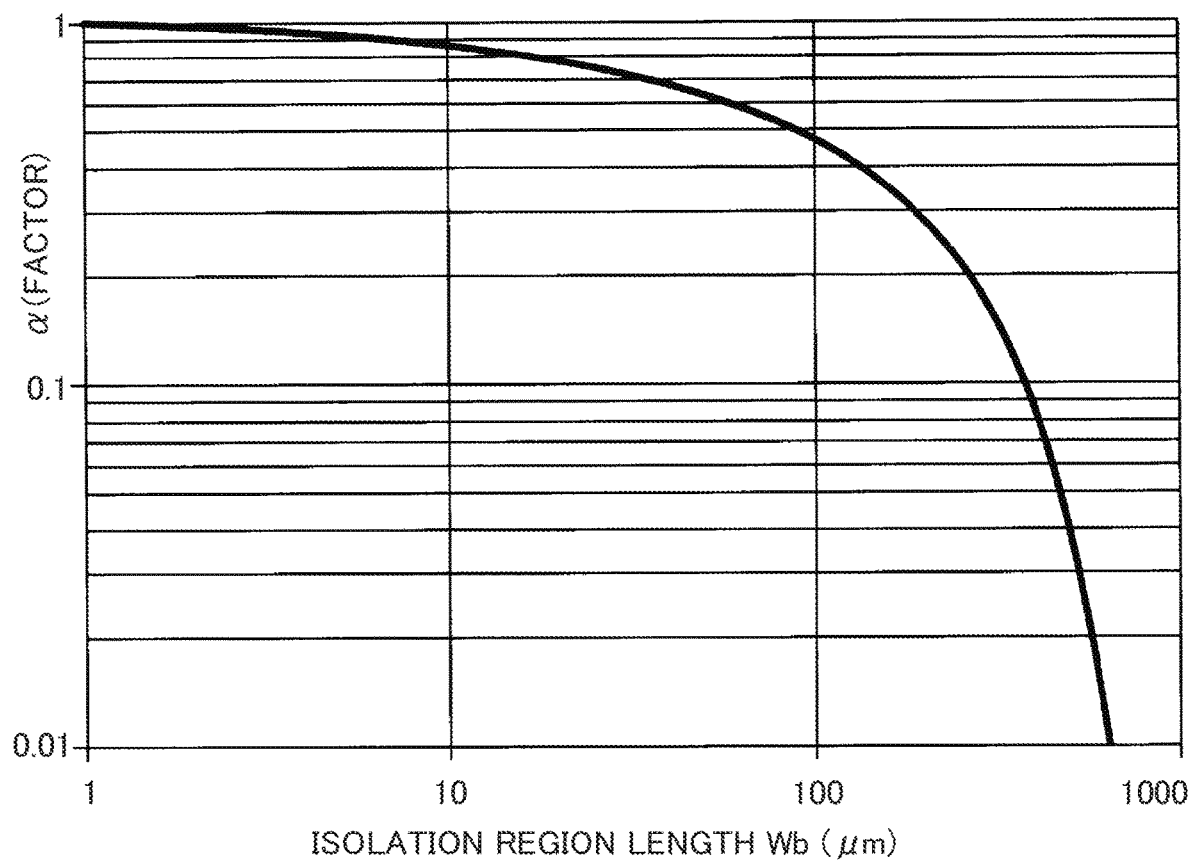
FIG. 9 is an illustrative graph showing an example current gain α in the parasitic transistor in FIG. 8.

FIG. 9 is an illustrative graph showing an example current gain α in the parasitic transistor 701 in FIG. 8. FIG. 9 illustrates an example relationship between a length Wb of the isolation region and a current gain α which is calculated from the above equation.

The relationship between the length Wb of the isolation region and the current gain α changes according to impurity concentration and the mobility of carriers. In order to set the current gain α to 0.5 or less, an isolation region length of approximately 100 μm or greater may be preferably ensured.

With such a configuration, in addition to the same advantageous effects as those in the first embodiment, it is possible to prevent electric charges in the backup circuit 601 from flowing out to the outside when the bipolar transistor 711 of the regulator 102 breaks down. Further, it is possible to reduce the electric current flowing out through the parasitic transistor 701 to the power supply terminal 101.

In this manner, the voltage V1 can be maintained stably over a longer time period.

Fourth Embodiment

<Overview>

In a fourth embodiment, a technique is described by which to provide hysteresis to each of the detection thresholds VTE, VT1, VT2 used by the voltage monitoring circuit 104.

<About Detection Threshold Hysteresis>

The in-vehicle semiconductor device 100 is configured similarly to FIG. 1 in the first embodiment, and differs from the first embodiment in that hysteresis is provided to the detection thresholds VTE, VT1, VT2 used by the voltage monitoring circuit 104.

The detection threshold VTE with hysteresis includes detection thresholds VTEh, VTEl. Likewise, the detection threshold VT1 includes detection thresholds VT1h, VT1l, and the detection threshold VT2 includes detection thresholds VT2h, VT2l.

The detection threshold VTEl is a threshold to detect a voltage VE drop, and the detection threshold VTEh is a threshold to detect that the dropping voltage VE has been recovered. The detection threshold VT1l is a threshold to detect a voltage V1 drop, and the detection threshold VT1h is a threshold to detect that the dropping voltage V1 has been recovered. The detection threshold VT2l is a threshold to detect a voltage V2 drop, and the detection threshold VT2h is a threshold to detect that the dropping voltage V2 has been recovered.

<Example Operation of Voltage Monitoring Circuit>

Subsequently, a description is given of the operation in the voltage monitoring circuit 104 with hysteresis being provided to the detection thresholds VTE, VT1, VT2.

Figure 10:
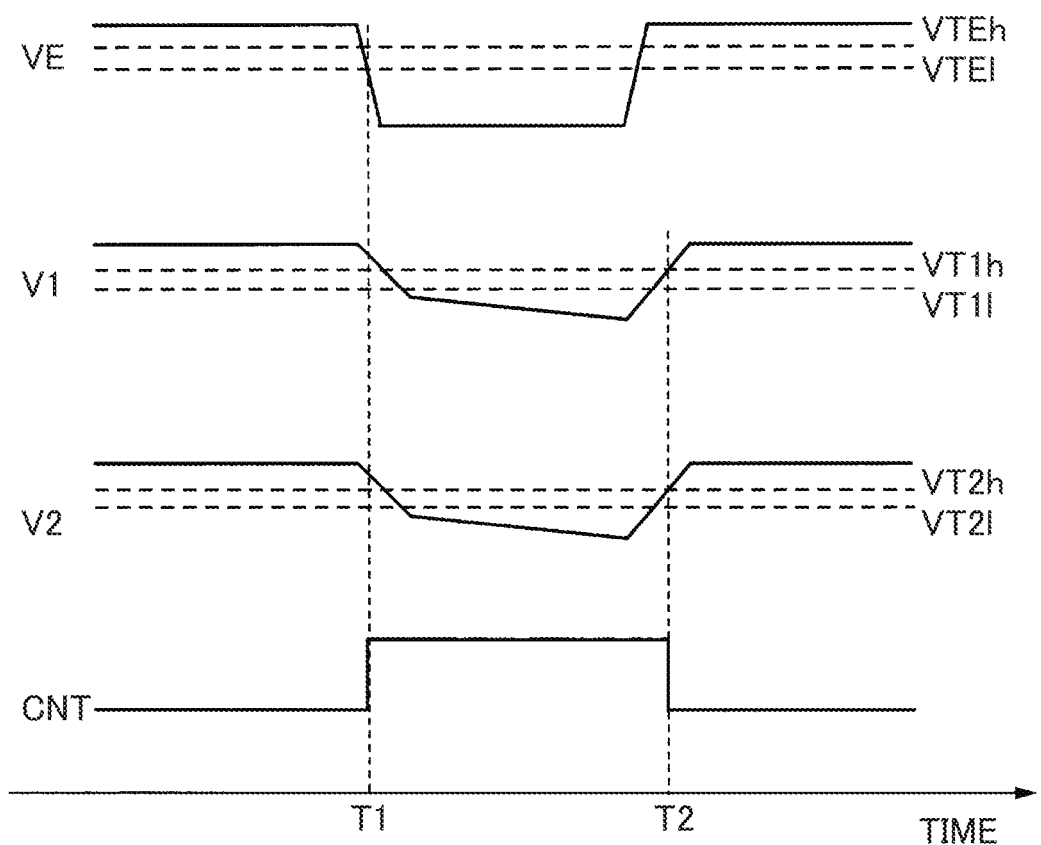
FIG. 10 is a timing chart showing example operation in a voltage monitoring circuit in accordance with a fourth embodiment.

FIG. 10 is a timing chart showing example operation in the voltage monitoring circuit 104 in accordance with a fourth embodiment. FIG. 10 illustrates timing for each signal output from the voltage monitoring circuit 104 when the voltage VE drops due to a negative surge.

From the top toward the bottom of FIG. 10, FIG. 10 separately shows signal timing for the voltage VE supplied from the ECU, the voltage V1 output from the regulator 102, the voltage V2 output from the regulator 102a, and the control signal CNT output from the voltage monitoring circuit 104.

In FIG. 10, for example, to detect a voltage of the voltage VE, upon the voltage VE being below the detection threshold VTEl, the voltage drop detecting circuit 400 in FIG. 4 outputs a Lo-level signal. Then, the voltage level of the voltage VE below the detection threshold VTEl gradually is recovered. Then, upon the voltage level of the voltage VE exceeding the detection threshold VTEh, the voltage drop detecting circuit 400 outputs a Hi-level signal. The voltage drop detecting circuits 401, 402 respectively monitoring the voltages V1, V2 perform the same operation using the detection thresholds VT1h, VT1l, VT2h, VT2l.

Then, when all the voltages VE, V1, V2 exceed the respective detection thresholds VTEh, VT1h, VT2h, the NAND circuit 407 in the voltage monitoring circuit 104 in FIG. 4 outputs an inactive, i.e., Lo-level control signal CNT. The subsequent operation is similar to that in FIG. 1 in accordance with the first embodiment.

The surge applied to the voltage VE is noise. Therefore, in association with this, noise also occurs in the voltages VE, V1, V2. IF the noise occurs frequently in a short time period around the detection thresholds VTE, VT1, VT2, a glitch occurs in the control signal CNT.

However, as described above, providing hysteresis to each of the detection thresholds VTE, VT1, VT2 enables prevention of a glitch from occurring in the control signal CNT.

As a technique to allow the detection thresholds VTE, VT1, VT2 to have hysteresis, for example, a transistor may be used to change, as appropriate, the voltage division ratio of the resistors 404, 405 shown in FIG. 4 when a voltage drop is detected, or alternatively, the voltage drop detecting circuits 400, 401, 402 may be configured as a Schmitt trigger logic circuit.

In this manner, in addition to the same advantageous effects as those in the in-vehicle semiconductor device 100 in accordance with the first embodiment, it is possible to decrease the frequency of turning on and off the clock signal CLK due to a glitch occurring in the control signal CNT.

Because of this, the operation of the processor 105 shown in FIG. 1 becomes less unstable, leading to the realization of the in-vehicle semiconductor device 100 with higher resistance against malfunction.

It is noted that the detection thresholds VTEl, VT1l, VT2l may be different voltage values from each other. Each of the voltage ranges that the processor and the oscillator can normally operate may be determined by simulation, experiment and the like, and, based on the result, the detection thresholds VT1l, VT2l may be decided independently.

This enables a reduction in unnecessary activation of the control signal CNT. Further, the detection threshold VTEl may be set at a voltage value at which fluctuations in power-supply voltage are not falsely detected during radio wave irradiation tests.

<About Voltage VE in Radio-Wave Irradiation Test>

Figure 11:
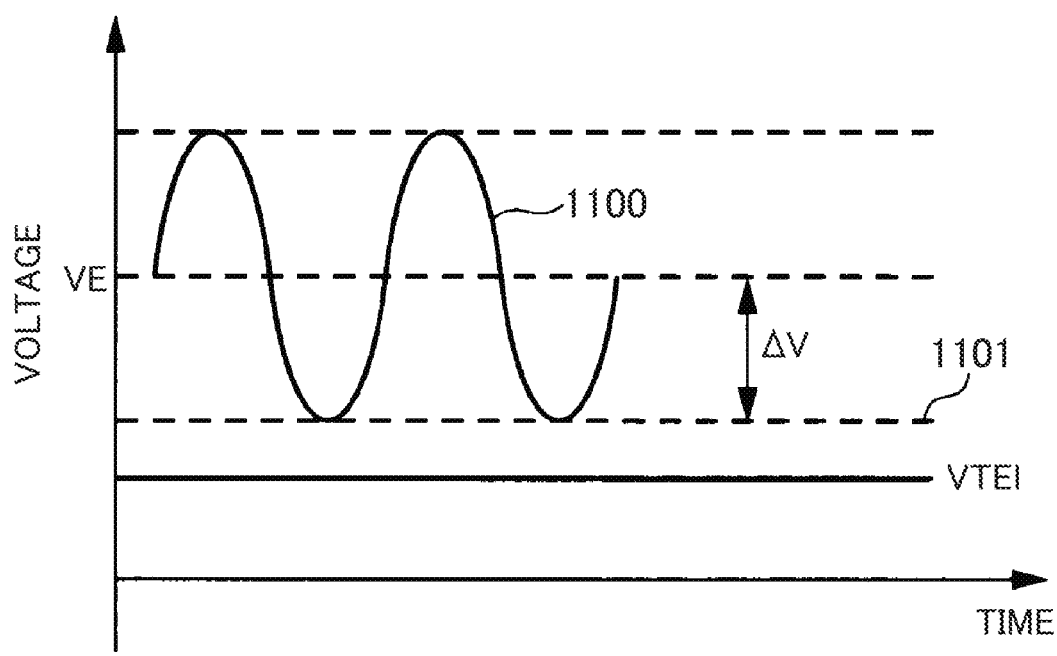
FIG. 11 is an illustrative graph showing an example voltage fluctuation waveform in the voltage applied to a power supply terminal during a radio wave irradiation test.

FIG. 11 is an illustrative graph showing an example voltage fluctuation waveform of the voltage VE applied to the power supply terminal 101 during a radio wave irradiation test.

As used herein, the radio wave irradiation test is referred to as a BCI (Bulk Current Injection) test, a TEM (Tranceverse Electromagnetic) cell test and the like, in which a wire harness and an in-vehicle semiconductor device are irradiated with radio wave.

During the radio wave irradiation, a voltage 1100 with a sine wave superimposed is provided to the power supply terminal 101 of the in-vehicle semiconductor device 100 shown in FIG. 1, by way of example. A voltage fluctuation ΔV at this moment is in a range that is sufficiently below the voltage fluctuation due to a surge and absorbed mostly by the regulators 102, 102a.

On the other hand, unlike a surge, because of the long-duration irradiation at various frequencies, if application of the clock signal CLK is stopped every time the detection is made by the voltage monitoring circuit 104, the routine operation of the in-vehicle semiconductor device 100 may remain stopped depending on conditions.

To avoid this, in the radio wave irradiation test, the detection threshold VTEl is preferably set to be lower than a level 1101 lowered from the voltage VE by ΔV to avoid activating the control signal CNT.

Fifth Embodiment

<Overview>

In the fifth embodiment, a technique is described in which the switch 107 illustrated in FIG. 1 in accordance with the first embodiment has a clock shaping function for shaping a waveform of the clock signal CLK.

<Example Configuration of Switch>

Figure 12:
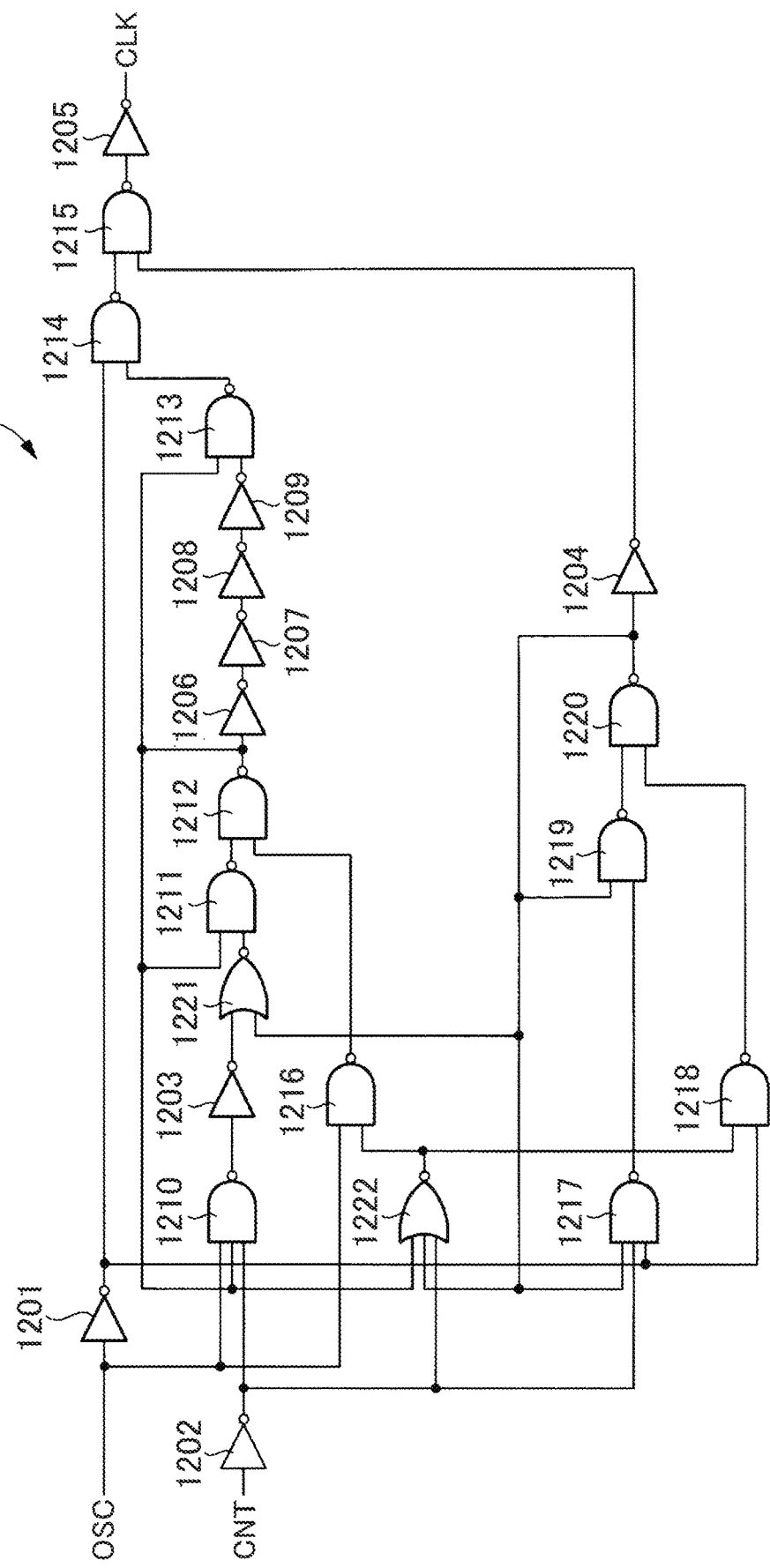
FIG. 12 is an illustrative diagram showing an example configuration in a switch in accordance with a fifth embodiment.

FIG. 12 is an illustrative diagram showing an example configuration in the switch 107 in accordance with the fifth embodiment. Incidentally, the configuration of the in-vehicle semiconductor device 100 is similar to that shown in FIG. 1 in accordance with the first embodiment, and differs in the switch 107 illustrated in FIG. 12.

The switch 107 includes inverters 1201 to 1209, NAND (negative AND) circuits 1210 to 1220, and NOR (negative OR) circuits 1221, 1222.

The clock OSC of the oscillator 106 in FIG. 1 is input to each of an input part of the inverter 1201, a first input part of the NAND circuit 1210 and one of input parts of the NAND circuit 1216. The control signal CNT of the voltage monitoring circuit 104 in FIG. 1 is input to an input part of the inverter 1202.

An output part of the inverter 1202 is connected to each of a third input part of the NAND circuit 1210, a third input part of the NOR circuit 1222 and a second input part of the NAND circuit 1217.

An output part of the NAND circuit 1210 is connected to an input part of the inverter 1203, and an output part of the inverter 1203 is connected to one of input parts of the NOR circuit 1221. An output part of the NOR circuit 1221 is connected to one of input parts of NAND circuit 1211, and an output part of NAND circuit 1211 is connected to one of input parts of the NAND circuit 1212.

The inverters 1206 to 1209 connected in series are connected between an output part of the NAND circuit 1212 and one of input parts of the NAND circuit 1213. An output part of the NAND 1213 is connected to one of input parts of the NAND circuit 1214, and an output part of the NAND circuit 1214 is connected to one of input parts of the NAND circuit 1215.

Further, the other input part of the NAND circuit 1215 is connected to an output of the inverter 1204, and an output part of the NAND circuit 1215 is connected to an input part of the inverter 1205. An output part of the inverter 1205 serves as the output part of the switch 107, and the clock signal CLK is output from the output part of the switch 107 to be provided to the processor 105 in FIG. 1.

The output part of the NAND circuit 1212 is connected to each of the other input parts of the NAND circuits 1211, 1213, a second input part of the NAND circuit 1210 and a first input part of the NOR circuit 1222.

The other input part of the NAND circuit 1212 is connected to an output part of the NAND circuit 1216, and an output part of the NOR circuit 1222 is connected to each of the other input part of the NAND circuit 1216 and one of input parts of the NAND circuit 1218.

An output part of the NAND circuit 1217 is connected to one of input parts of the NAND circuit 1219, and an output part of the NAND circuit 1218 is connected to one of input parts of the NAND circuit 1220.

An output part of the NAND circuit 1219 is connected to the other input part of the NAND circuit 1220, and an output part of the NAND circuit 1220 is connected to each of an input part of the inverter 1204, the other input part of the NAND circuit 1219, the other input part of the NOR circuit 1221, a second input part of the NOR circuit 1222 and a first input part of the NAND circuit 1217.

An output part of the inverter 1201 is connected to each of the other input part of the NAND circuit 1214, a third input part of the NAND circuit 1217, and the other input part of the NAND circuit 1218. The output part of the inverter 1204 is connected to the other input part of the NAND circuit 1215.

<Description of Clock Shaping Function of Switch>

Subsequently, the operation of the switch 107 with the configuration illustrated in FIG. 12 is described.

Figure 13:
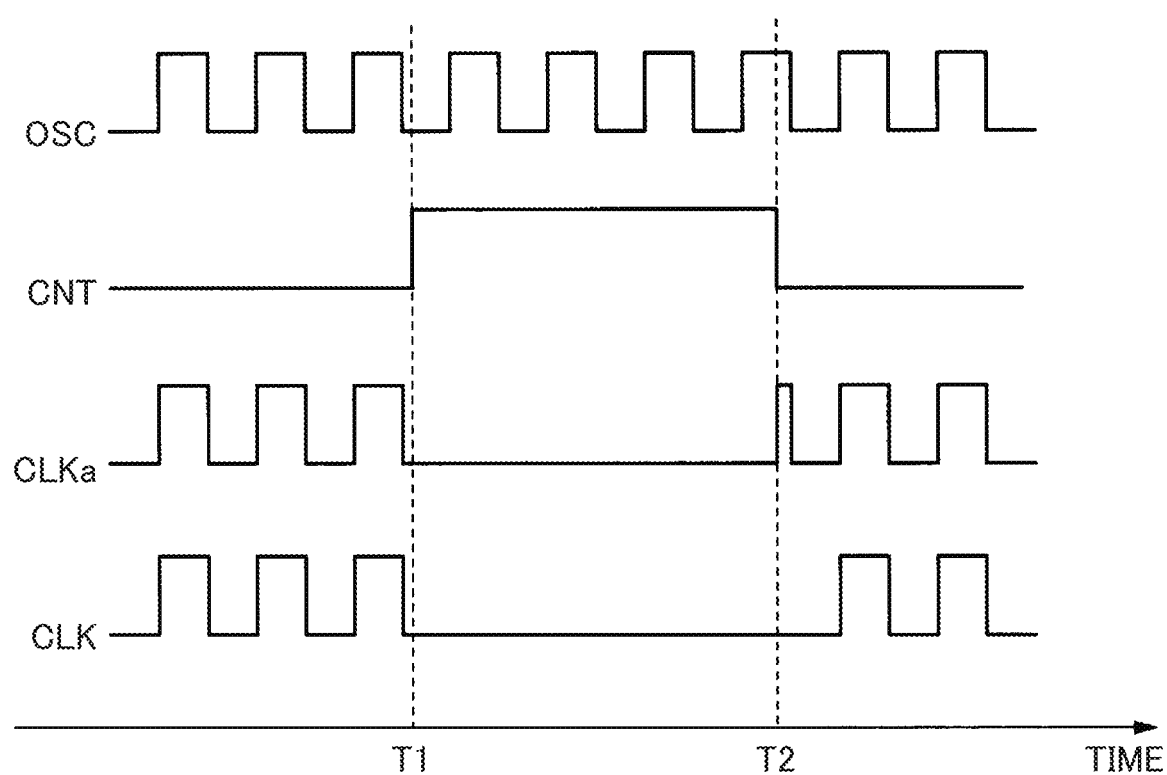
FIG. 13 is an illustrative diagram showing an example operation waveform in the switch in FIG. 12.

FIG. 13 is an illustrative diagram showing an example operation waveform in the switch 107 in FIG. 12. From the top toward the bottom of FIG. 13, FIG. 13 separately shows signal timing for the clock OSC output from the oscillator 106, the control signal CNT output from the voltage monitoring circuit 104, and the clock signals CLKa, CLK output from the switch 107. Incidentally, the clock signal CLKa is a clock signal output from the switch 107 without the clock shaping function, and the clock signal CLK is a clock signal output from the switch 107 in FIG. 12, that is, the switch 107 having the clock shaping function.

The clock shaping function in the switch 107 shown in FIG. 12 will be described below in detail.

First, the clock signal CLKa output from the switch 107 without the clock shaping function is described.

Since external noise such as a surge is randomly applied, random is also timing T1 at which the control signal CNT for stopping the clock OSC is activated for the clock OSC of an oscillation waveform in the oscillator 106.

Likewise, timing T2 at which the control signal CNT is cleared is also random. Assuming that the control signal CNT is cleared, i.e., deactivated at timing T2 shown in FIG. 13. At timing T2, the clock OSC is Hi.

In this case, with the switch 107 without the clock shaping function, when the control signal CNT is turned off, i.e., is deactivated, the clock signal CLKa which is output of the switch 107 is Hi, and, approximately at the same time when the clock OSC becomes Lo, the clock signal CLKa also becomes Lo. Therefore, a pulse shorter than that of a normal clock signal is applied to the processor 105.

As a result, the setup time/hold time required for normal operation of the processor 105 cannot be ensured, so that a malfunction may occur in the processor 105. The clock shaping function in the switch 107 holds the state of the clock OSC at the time when the control signal CNT is activated in order to prevent such a shorter-pulse clock signal from being output. Then, when the control signal CNT is cleared, the clock OSC is recovered from the state.

<Clock Signal Transition>

Subsequently, the clock signal CLK output from the switch 107 with the clock shaping function is described with reference to FIG. 14.

Figure 14:
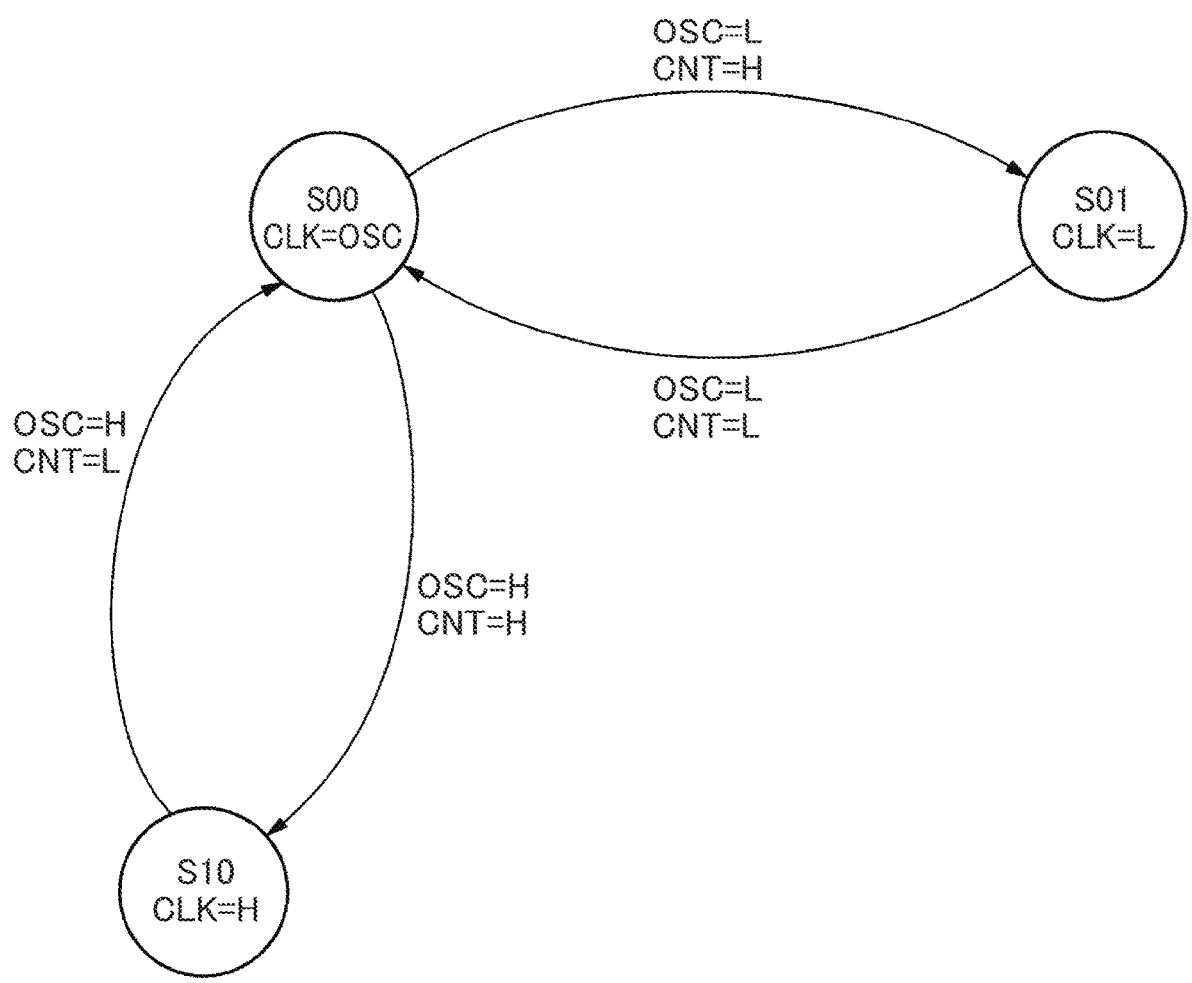
FIG. 14 is an illustrative diagram of an example state transition in the switch in FIG. 12.

FIG. 14 is an illustrative diagram of an example state transition in the switch 107 in FIG. 12.

At timing T1 when the control signal CNT is activated, the clock OSC is Lo, and when the control signal CNT is cleared at timing T2, the clock OSC in the Lo state is output. In FIG. 14, a state S00 is established under normal conditions, and the clock OSC is through-output as the clock signal CLK.

Where the control signal CNT becomes Hi when the clock OSC is Lo, transition to state S01 occurs, so that the clock signal CLK is fixed to Lo. The voltages VE, V1, V2 are recovered and the control signal CNT becomes Lo, whereupon the state S01 remains until the clock OSC becomes Lo, and only after the clock OSC has become Lo, transition back to state S00 occurs.

Likewise, where the control signal CNT becomes Hi when the clock OSC is Hi, transition to state S10 occurs, so that the output of the clock signal CLK is fixed to Hi. After the control signal CNT has become Lo, the state S10 remains until the clock OSC becomes Hi, and after the clock OSC has become Hi, transition back to state S00 occurs.

In this manner, in addition to the same advantageous effects as those in the in-vehicle semiconductor device 100 in accordance with the first embodiment, the clock CLK satisfying the setup time/hold time can be provided to the processor even when a surge is applied at any timing. As a result, the resistance against malfunction can be further enhanced.

Sixth Embodiment

<Overview>

In the sixth embodiment, an example is described in which the circuit block of the in-vehicle semiconductor device 100 is isolated by the isolation region 802 shown in FIG. 8 in the third embodiment.

<Example Layout of in-Vehicle Semiconductor Device>

Figure 15:
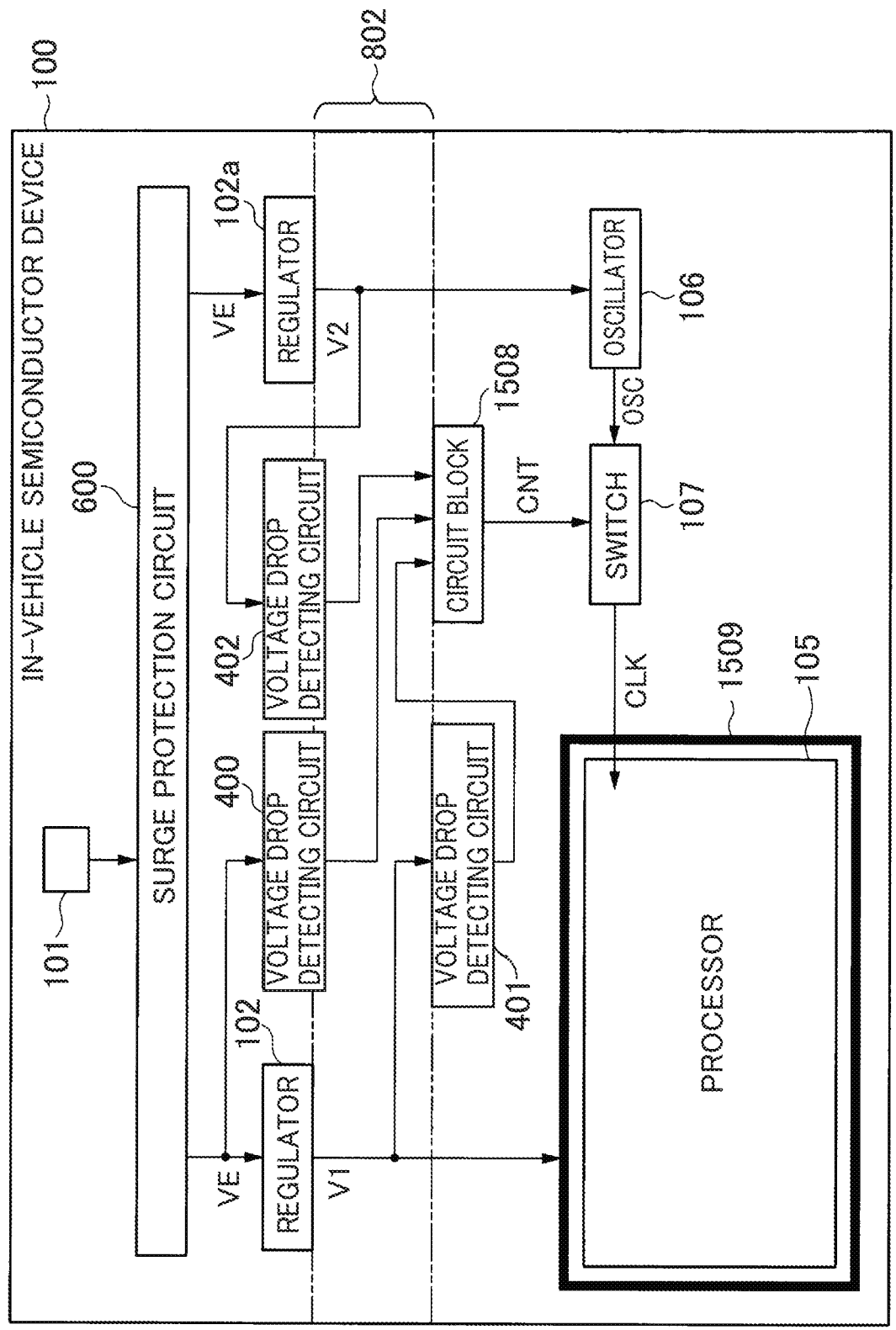
FIG. 15 is an illustrative block diagram showing example layout of an in-vehicle semiconductor device in accordance with a sixth embodiment.

FIG. 15 is an illustrative block diagram showing example layout of the in-vehicle semiconductor device 100 in accordance with the sixth embodiment.

As illustrated in FIG. 15, the in-vehicle semiconductor device 100 has the power supply terminal 101, the surge protection circuit 600, the regulators 102, 102*a*, the voltage drop detecting circuits 400, 401, 402, a circuit block 1508, the oscillator 106, the switch 107, the processor 105 and a power supply ring 1509. The circuit block 1508 includes the NAND circuit 407 and the level conversion circuit 502. The power supply ring 1509 powers the processor 105 and the like.

The in-vehicle semiconductor 100 has the circuit blocks isolated by the isolation region 802 as shown in FIG. 15.

As described earlier, when a negative surge is applied, the voltage V1 to be provided to the processor 105 may drop due to the influence of the parasitic transistor. To avoid this, specifically, the isolation region 802 provides isolation between two groups: one of the surge protection circuit 600, the regulators 102, 102*a*, and the voltage drop detection circuits 400, 402; the other of the voltage drop detection circuit 401, the circuit block 1508, the oscillator 106, the switch 107 and the processor 105. In other words, the circuit block operated by the voltage VE and the circuit block operated by the voltages V1, V2 are isolated by the isolation region 802. The circuit block operated by the voltage VE translates to the circuit block to which a negative voltage may be applied when a surge is applied.

In this manner, it is possible to reduce the current flowing out to the power supply terminal 101 through the parasitic transistor 701 in FIG. 7 and the like, and thus the voltage V1 can be stably maintained for a longer time period.

Seventh Embodiment

<Overview>

In the seventh embodiment, an in-vehicle sensor system configured using the in-vehicle semiconductor device 100 is described.

<Example Configuration of in-Vehicle Sensor System>

Figure 16:
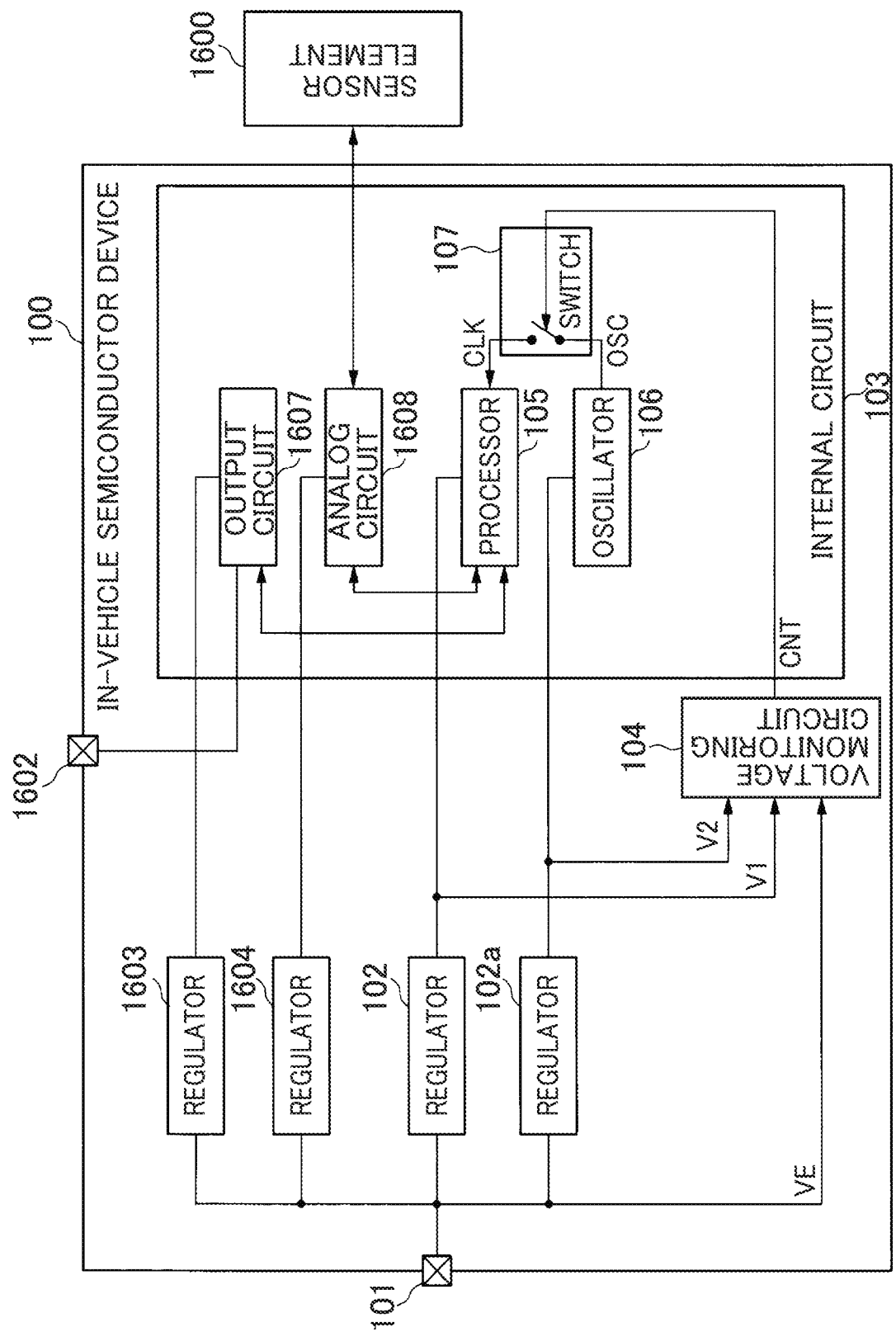
FIG. 16 is an illustrative block diagram showing an example configuration in an in-vehicle sensor system in accordance with a seventh embodiment.

FIG. 16 is an illustrative block diagram showing an example configuration in an in-vehicle sensor system in accordance with the seventh embodiment.

As illustrated in FIG. 16, the in-vehicle sensor system has a sensor element 1600 and the in-vehicle semiconductor device 100. The sensor element 1600 is an element that changes its electrical characteristics based on a physical quantity, which may be, for example, an airflow sensor or the like. The airflow sensor is an element that measures the amount of air taken in by the engine. Although the case where the sensor element 1600 is an airflow sensor is described herein, the sensor element 1600 only needs to be an element that changes its electrical characteristics based on a physical quantity as described above, and therefore the sensor element 1600 is not limited to the case.

Also, in FIG. 16, the airflow sensor is illustrated as a discrete component, but is not limited to this. For example, the airflow sensor may be formed integrally with the in-vehicle semiconductor device 100.

The in-vehicle semiconductor device 100 has regulators 1603, 1604 in addiction to the configuration of the in-vehicle semiconductor device 100 in FIG. 1 in accordance with the first embodiment. Further, the internal circuit 103 has an analog circuit 1608, an output circuit 1607 and an output terminal 1602 in addition to the configuration of the internal circuit 103 in FIG. 1.

The regulator 1603 generates an operation voltage to be provided to the output circuit 1607, from the voltage VE supplied from the ECU. The regulator 1604 generates, from the voltage VE, an operation voltage to be provided to the analog circuit 1608.

The processor 105 controls the sensor element 1600 through the analog circuit 1608. Further, the processor 105 obtains a signal output from the sensor element 1600 by way of the analog circuit 1608. The analog circuit 1608 performs the so-called A/D conversion in which the analog signal output from the sensor element 1600 is converted to a digital signal, and the analog circuit 1608 outputs the conversion result to the processor 105.

The processor 105 performs computing operation on the digital signal received from the analog circuit 1608. The computing operation includes, for example, data correction of the digital signal, and the like. The data after the computing operation is output from the processor 105 to the output terminal 1602 via the output circuit 1607.

The output terminal 1602 is connected to the ECU. The ECU performs engine control based on the data output from the output circuit 1607. As described above, where the sensor element 1600 is the airflow sensor, the ECU outputs a control instruction for fuel to be injected on the basis of the data output from the output circuit 1607.

In this manner, the signals of the sensor element 1600 are processed by the in-vehicle semiconductor device 100 with high resistance against malfunction. This enables an increase in reliability of the in-vehicle sensor system.

Although the invention made by the inventors has been described in detail based on embodiments, the present invention is not limited to the embodiments, and it is apparent that various changes can be made without departing from the spirit or scope of the present invention.

It should be noted that the present invention is not limited to the aforementioned embodiments, and various modifications are included. For example, the aforementioned embodiments have been described in detail for making the present invention easier to understand, and they are not necessarily limited to all the aforementioned configurations.

Further, part of the configuration of one embodiment may be replaced with the configuration of another embodiment, or the configuration of one embodiment may be added to the configuration of another embodiment. Further, for part of the configuration of each embodiment, another configuration may be added, deleted and replaced.

LIST OF REFERENCE SIGNS

100 In-vehicle semiconductor device
101 Power supply terminal
102 Regulator
102a Regulator
103 Internal circuit
104 Voltage monitoring circuit
105 Processor
106 Oscillator
107 Switch
400 Voltage drop detecting circuit
401 Voltage drop detecting circuit
402 Voltage drop detecting circuit
403 Level conversion circuit
404 Resistor
405 Resistor
406 Transistor
407 NAND circuit
408 Current supply
500 Regulator
501 Capacitor
502 Level conversion circuit
600 Surge protection circuit
601 Backup circuit
602 Surge protection resistor
603 Clamping element
700 Parasitic diode
701 Parasitic transistor
710 Transistor
711 Transistor
712 Current supply
713 Amplifier
714 Resistor
715 Resistor
800 N-well
801 N-well
802 Isolation region
803 P-type substrate

The invention claimed is:

1. An in-vehicle semiconductor device, comprising:
a first regulator that converts a voltage level of a first voltage externally supplied, to generate a second voltage;
a second regulator that converts a voltage level of the first voltage to generate a third voltage;
an internal circuit to which each of the second voltage and the third voltage is provided; and
a voltage monitoring unit that monitors the first, second, and third voltages,
wherein the internal circuit includes:
a processor that is operated by the second voltage provided from the first regulator; and
an oscillator that is operated by the third voltage provided from the second regulator, the oscillator generating a clock signal, that is provided to the processor through a switch unit and which serves as an operation clock for the processor,
the voltage monitoring unit stops providing the clock signal to the processor when a voltage level of at least any one of the first, second and third voltages is below a set value, and provides the clock signal to the processor when voltage levels of all the first, second and third voltages exceed the set value,
wherein the voltage monitoring unit includes:
a voltage monitoring circuit that outputs a first control signal when a voltage level of at least one of the first, second and third voltages is below the set value, and outputs a second control signal when all the voltage levels of the first, second and third voltages exceed the set value; and the switch unit that provides or stops the clock signal to the processor on the basis of the first control signal or the second control signal, the switch unit holds the Lo level of the clock signal when the first control signal is input when the clock signal is at the Lo level, the switch unit does not supply the clock signal to the processor until the clock signal output from the oscillator and the held clock signal respectively become Lo level when the second control signal is input while the Lo level clock signal is being held, the switch unit holds the Hi level of the clock signal when the first control signal is input when the clock signal is at the Hi level, and the switch unit does not supply the clock signal to the processor until the clock signal output from the oscillator and the held clock signal respectively become Hi level when the second control signal is input while holding the Hi level clock signal.

2. The in-vehicle semiconductor device according to claim 1, further comprising a surge protection circuit that absorbs a surge applied to the first voltage, wherein the first voltage monitored by the voltage monitoring unit is provided from the surge protection circuit.

3. The in-vehicle semiconductor device according to claim 1, wherein the voltage monitoring circuit includes:
a first voltage drop detecting circuit that outputs a first detection signal when the voltage level of the first voltage is below a first set value, and outputs a second detection signal when the voltage level of the first voltage exceeds the first set value;
a second voltage drop detecting circuit that outputs a third detection signal when the voltage level of the second voltage is below a second set value, and outputs a fourth detection signal when the voltage level of the second voltage exceeds the second set value;
a third voltage drop detecting circuit that outputs a fifth detection signal when the voltage level of the third voltage is below a third set value, and outputs a sixth detection signal when the voltage level of the third voltage exceeds the third set value; and
a control-signal generator that outputs the first control signal to the switch unit when at least any one of the first, third and fifth detection signals is input, and outputs the second control signal to the switch unit when all the second, fourth and sixth detection signals are input.

4. The in-vehicle semiconductor device according to claim 3, further comprising a level conversion circuit that either converts the first to sixth detection signals to a voltage matching a voltage level of the control-signal generator or converts the first and second control signals output from the voltage monitoring circuit to a voltage matching a voltage level of the switch unit.

5. The in-vehicle semiconductor device according to claim 3, wherein at least one of the first to third set values of the respective first to third voltage drop detecting circuits has hysteresis.

6. The in-vehicle semiconductor device according to claim 1, further comprising a third regulator that converts a voltage level of the first voltage to generate a fourth voltage, wherein the fourth voltage generated by the third regulator is provided as an operation voltage for the voltage monitoring circuit.

7. The in-vehicle semiconductor device according to claim 1, wherein the switch unit holds a state of the clock signal when the first control signal is input, and when the second control signal is input, if the clock signal output from the oscillator and the held clock signal have different logic values, the switch unit outputs the logic value of the held clock signal until the clock signal output from the oscillator and the held clock signal have the same logic value.

8. The in-vehicle semiconductor device according to claim 1, wherein the in-vehicle semiconductor device processes a signal obtained by a sensor element that changes its electrical characteristics based on a physical quantity.

9. The in-vehicle semiconductor device according to claim 1, wherein the first voltage is supplied from an engine control unit.

10. An in-vehicle semiconductor device, comprising:
a first regulator that converts a voltage level of a first voltage externally supplied, to generate a second voltage;
a second regulator that converts a voltage level of the first voltage to generate a third voltage;
an internal circuit to which each of the second voltage and the third voltage is provided; and
a voltage monitoring unit that monitors the first, second, and third voltages,
wherein the internal circuit includes:
a processor that is operated by the second voltage provided from the first regulator; and
an oscillator that is operated by the third voltage provided from the second regulator, the oscillator generating a clock signal serving as an operation clock for the processor,
the voltage monitoring unit stops providing the clock signal to the processor when a voltage level of at least any one of the first, second and third voltages is below a set value, and provides the clock signal to the processor when voltage levels of all the first, second and third voltages exceed the set value,
wherein the voltage monitoring unit includes:
a voltage monitoring circuit that outputs a first control signal when a voltage level of at least one of the first, second and third voltages is below the set value, and outputs a second control signal when all the voltage levels of the first, second and third voltages exceed the set value;
a switch unit that provides or stops providing the clock signal to the processor on the basis of the first control signal or the second control signal output from the voltage monitoring circuit,
wherein the voltage monitoring circuit includes:
a first voltage drop detecting circuit that outputs a first detection signal when the voltage level of the first voltage is below a first set value, and outputs a second detection signal when the voltage level of the first voltage exceeds the first set value;
a second voltage drop detecting circuit that outputs a third detection signal when the voltage level of the second voltage is below a second set value, and outputs a fourth detection signal when the voltage level of the second voltage exceeds the second set value;

a third voltage drop detecting circuit that outputs a fifth detection signal when the voltage level of the third voltage is below a third set value, and outputs a sixth detection signal when the voltage level of the third voltage exceeds the third set value; and a control-signal generator that outputs the first control signal to the switch unit when at least any one of the first, third and fifth detection signals is input, and outputs the second control signal to the switch unit when all the second, fourth and sixth detection signals are input.

11. The in-vehicle semiconductor device according to claim 10, further comprising a level conversion circuit that either converts the first to sixth detection signals to a voltage matching a voltage level of the control-signal generator or converts the first and second control signals output from the voltage monitoring circuit to a voltage matching a voltage level of the switch unit.

12. The in-vehicle semiconductor device according to claim 10, wherein at least one of the first to third set values of the respective first to third voltage drop detecting circuits has hysteresis.

* * * * *